US006720126B2

(12) United States Patent
Shimomura et al.

(10) Patent No.: US 6,720,126 B2
(45) Date of Patent: Apr. 13, 2004

(54) LASER THERMAL TRANSFER RECORDING METHOD

(75) Inventors: Akihiro Shimomura, Fujinomiya (JP); Yoshiharu Sasaki, Fujinomiya (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/343,950

(22) PCT Filed: May 21, 2002

(86) PCT No.: PCT/JP02/04919

§ 371 (c)(1), (2), (4) Date: Feb. 5, 2003

(87) PCT Pub. No.: WO02/096667

PCT Pub. Date: Dec. 5, 2002

(65) Prior Publication Data

US 2003/0207196 A1 Nov. 6, 2003

(30) Foreign Application Priority Data

May 28, 2001 (JP) ....................................... 2001-159135
Jun. 5, 2001 (JP) ....................................... 2001-169657

(51) Int. Cl.[7] .......................... B41M 5/38; B41M 5/40; B41H 2/32; G03F 7/34

(52) U.S. Cl. ....................................... 430/200; 430/201

(58) Field of Search .................................. 430/200, 201

(56) References Cited

U.S. PATENT DOCUMENTS

| | | | | |
|---|---|---|---|---|
| 5,821,028 A | | 10/1998 | Maejima et al. | |
| 5,939,231 A | | 8/1999 | Kawamura et al. | |
| 6,027,850 A | * | 2/2000 | Kawakami et al. | 430/200 |
| 6,261,995 B1 | | 7/2001 | Nakajima et al. | |
| 6,326,121 B1 | * | 12/2001 | Takahashi et al. | 430/200 |

FOREIGN PATENT DOCUMENTS

| | | |
|---|---|---|
| JP | 7-276681 | 10/1995 |
| JP | 8-224975 | 9/1996 |
| JP | 10-193816 | 7/1998 |
| JP | 11-170581 | 6/1999 |
| JP | 11-334232 A | 12/1999 |
| JP | 2000-141722 A | 5/2000 |
| JP | 2000-141723 | 5/2000 |
| JP | 2001-10094 | 1/2001 |
| JP | 2001-105752 | 4/2001 |

* cited by examiner

*Primary Examiner*—Richard L. Schilling
(74) *Attorney, Agent, or Firm*—Sughrue Mion, PLLC

(57) ABSTRACT

It is intended to provide a laser thermal transfer recording method which comprises the steps of feeding an image receptor sheet and a plural number of thermal transfer sheets from a recording medium cassette, superposing the image receptor layer of the image receptor sheet upon the image formation layer of the thermal transfer sheets and holding them on a recording medium support member, and then irradiating the thermal transfer sheets with laser beams appropriate for image data to transfer the laser-irradiated regions on the image formation layer onto the image receptor layer of the image receptor sheet thereby recording an image, characterized in that the image receptor sheet and the thermal transfer sheets are laminated in the order of feeding into the recording medium support member and contained in the recording medium cassette and the coefficient(s) of static friction of the back layer surface of the image receptor sheet and/or the above-described thermal transfer sheets are 0.7 or below. According to this laser thermal transfer recording method, each sheet can be transported and fed in a stable state without causing jamming or positioning error to thereby give an image free from any defect in the image caused by the adhesion of foreign materials or mistaken color recording order due to an error in manual operation.

11 Claims, 7 Drawing Sheets

LASER THERMAL TRANSFER RECORDING METHOD

TECHNICAL FIELD

This invention relates to a laser thermal (heat) transfer recording method whereby a full-color image with a high resolution is formed using laser beams. More specifically, it relates to a laser thermal transfer recording method which is useful in forming a color proof (DDCP: direct digital color proof) or a mask image by laser recording derived from digital image signals in the filed of printing.

BACKGROUND ART

In the field of graphic art, a printing plate is baked with the use of a set of color separation films constructed from an original color copy using lith films. Prior to the main printing (i.e., the practical printing procedure), it has been a practice to form a color proof from the color separation films in order to check errors in the color separation step and examine the necessity for color correction, etc. It is desired that such a color proof has a high resolution power so as to allow high reproducibility of medium contrast images, a high process stability and the like. To obtain a color proof closely similar to the actual printed matter, it is preferable to employ the same materials as used in the actual printed matter (for example, printing paper as a base material and pigments as colorants) in the color proof. To form a color proof, it is also highly desirable to use a dry method without resort to any developers.

As a dry method for forming a color proof, there has been developed a recording system wherein a color proof is directly formed from digital signals with the recent popularization of the electronic systems in the pre-printing step (in the pre-press industry). These electronic systems aim at, in particular, forming color proofs with high image qualities. In general, dot images of 150 lines per inch or above can be reproduced thereby. To record a proof with high image qualities from digital signals, use is made of, as a recording head, laser beams which can be appropriately modulated depending on digital signals and by which recording beams can be finely stopped down. Accordingly, it has been required to develop a recording material having a high sensitivity to laser beams and showing a high resolution power enabling the reproduction of highly fine dots.

As recording materials usable in the transfer image-formation method with the use of laser beams, there are known hot-melt transfer sheets having a photothermal conversion layer, which absorbs laser beams and generate heat, and an image formation layer, in which a pigment is dispersed in other components such as a hot-melt wax and a binder, on a substrate in this order (JPA 5-58045). In the image formation method using these recording materials, the image forming layer is molten in the parts corresponding to the heat generated from laser-irradiated region of the photothermal conversion layer and thus transferred onto the image receptor sheet provided on the transfer sheet. Thus the transferred image is formed on the image receptor sheet.

JPA 6-219052 discloses a thermal transfer sheet having a photothermal conversion layer containing a photothermal conversion substance, an extremely thin heat removable layer (0.03 to 0.3 $\mu$m) and an image forming layer containing a colorant on a substrate in this order. In this thermal transfer sheet, the binding force between the image formation layer and the photothermal conversion layer mediated by the above-described heat removable layer is weakened by irradiation with laser beams and thus a very fine image is formed on the image receptor sheet provided on the thermal transfer sheet. The phenomenon so-called “abbration” is utilized in the image formation method with the use of the above-described thermal transfer method. More particularly speaking, the heat removable layer is partly decomposed and vaporized in the laser-irradiated regions. As a result, the adhesiveness between the image receptor layer and the photothermal conversion layer is weakened in these regions and thus the image receptor layer in these regions is transferred onto the image receptor sheet laminated thereon.

These image forming methods have advantages such that a printing paper having an image receptor layer (an adhesive layer) can be used as an image receptor sheet material, a multicolor image can be easily obtained by successively transferring images with different colors on the image receptor sheet, and a highly fine image can be easily obtained. Therefore, these methods are useful in forming color proofs (DDCP: direct digital color proofs) or highly fine mask images.

To shorten the recording time in recording an image using laser beams, laser beams consisting of multibeam with the use of a plural number of laser beams are employed in recent years. In case of recording an image with the use of an existing thermal transfer sheet with multibeam laser beams, there sometimes arises a problem that the transferred image has only an insufficient density. A particularly serious decrease in image density is observed in high-energy laser recording. As the results of examinations by the present inventor, it has been clarified that such a decrease in image density is caused by uneven transfer occurring in case of high energy laser irradiation.

In the above-described recording methods, use is made of one image receptor sheet R and a plural number of thermal transfer sheets such as K (black), C (cyan), M (magenta) and Y (yellow). In recording media, it has been a practice to laminate 20 to 100 sheets of the same type and package. In case of packaging about 25 sheets as shown in FIG. 10, for example, recording media 1 of the same type are vacuum-packaged in a packaging material 3 such as a synthetic resin bag made of, for example, polyethylene and further packed in a decorative box 5 made of corrugated fiberboard or the like to give a package 7.

Prior to setting in a recorder, five types of such packages 7, i.e., an image receptor sheet R and thermal transfer sheets K, C, M and Y are opened. The recording media thus opened are manually set into a recording medium cassette of the recorder in the reverse order to the recording order. That is to say, the thermal transfer sheet Y is first taken out from the packages 7 having been opened and set into the cassette. Subsequently, the thermal transfer sheets, M, C and K and the image receptor sheet are similarly set into the cassette. Thus, a plural number of recording media consisting of the image receptor sheet and the thermal transfer sheets K, C, M and Y (from top to bottom) are laminated and set in the cassette. In case of setting a plural number of recording medium sets, the above-described procedure is to be repeated.

DISCLOSURE OF THE INVENTION

Since recording media of respective types are separately packaged in existing packages, one recording medium should be taken out from each of the packages of the image receptor sheet R and thermal transfer sheets K, C, M and Y having been opened and set into a cassette. Therefore, individual recording media are exposed to the outer surroundings and thus the possibility of the adhesion of foreign materials is elevated. The adhesion of foreign materials brings about a problem that printing cannot be normally carried out and there arise defects such as white spots and uneven ring pattern.

Moreover, the individual recording media should be manually set into the cassette in the reverse order to the printing order. Thus, there frequently arises a problem that the order of color recording is mistaken due to an error in setting.

Furthermore, the image receptor sheet or the thermal transfer sheets should be picked up from the recording medium cassette and transferred into the recorder using a picking up system such as a rubber roller or a sucking/adsorption system. During this operation, there arises another problem of positioning error or jamming.

Under these circumstances, the present invention aims at providing a laser thermal transfer recording method whereby an image receptor sheet or thermal transfer sheets can be transported and fed in a stable state without causing jamming or positioning error to thereby give an image free from any defects in the image caused by the adhesion of foreign materials or mistaken color recording order due to an error in manual operation.

The above problem can be solved by the following means.

1. A laser thermal transfer recording method which comprises the steps of feeding an image receptor sheet having an image receptor layer and a plural number of thermal transfer sheets having at least a photothermal conversion layer and an image formation layer on a substrate from a recording medium cassette, superposing the image receptor layer of the above-described image receptor sheet upon the image formation layer of the above-described thermal transfer sheets and holding them on a recording medium support member, and then irradiating the above-described thermal transfer sheets with laser beams appropriate for image data to transfer the laser-irradiated regions on the image formation layer onto the image receptor layer of the above-described image receptor sheet thereby recording an image, characterized in that the above-described image receptor sheet and the above-described thermal transfer sheets are laminated in the order of feeding into the recording medium support member and contained in the above-described recording medium cassette and the coefficient(s) of static friction of the back layer surface of the above-described image receptor sheet and/or the above-described thermal transfer sheets are 0.7 or below.

2. The laser thermal transfer recording method according to the above-described 1 characterized in that a package, which has the above-described image receptor sheet and the above-described thermal transfer sheets laminated in the order of feeding into the recording medium support member and packed therein, is opened and then the thus laminated image receptor sheet and thermal transfer sheets are set in the above-described recording medium cassette at once.

3. A laser thermal transfer recording method according to the above-described 1 or 2 characterized in that the coefficient of static friction of the image receptor layer surface of the above-described image receptor sheet is 0.5 or below.

4. A laser thermal transfer recording method according to any of the above-described 1 to 3 characterized in that the surface roughness Rz of the image receptor layer surface of the above-described image receptor sheet is from 1 to 5 $\mu$m.

5. A laser thermal transfer recording method according to any of the above-described 1 to 4 characterized in that the surface roughness Rz of the back layer surface of the above-described image receptor sheet is 3 $\mu$m or below.

6. A laser thermal transfer recording method according to any of the above-described 1 to 5 characterized in that the surface electrical resistance SR of the image receptor layer surface of the above-described image receptor sheet is $10^{14}\Omega$ or below when measured at 23° C. under 55% RH.

7. A laser thermal transfer recording method according to any of the above-described 1 to 6 characterized in that the surface electrical resistance SR of the back layer surface of the above-described image receptor sheet is $10^{12}\Omega$ or below when measured at 23° C. under 55% RH.

8. A laser thermal transfer recording method according to any of the above-described 1 to 7 characterized in that the coefficient of static friction of the image formation layer surface of the above-described thermal transfer sheets is 0.5 or below.

9. A laser thermal transfer recording method according to any of the above-described 1 to 8 characterized in that the surface roughness Rz of the image formation layer surface of the above-described thermal transfer sheets is 3 $\mu$m or below.

10. A laser thermal transfer recording method according to any of the above-described 1 to 9 characterized in that the surface roughness Rz of the back layer surface of the above-described thermal transfer sheets is 7 $\mu$m or below.

11. A laser thermal transfer recording method according to any of the above-described 1 to 10 characterized in that the surface electrical resistance SR of the image formation layer surface of the above-described thermal transfer sheets is $10^{11}\Omega$ or below when measured at 23° C. under 55% RH.

BEST MODE FOR CARRYING OUT THE INVENTION

Figure 1:
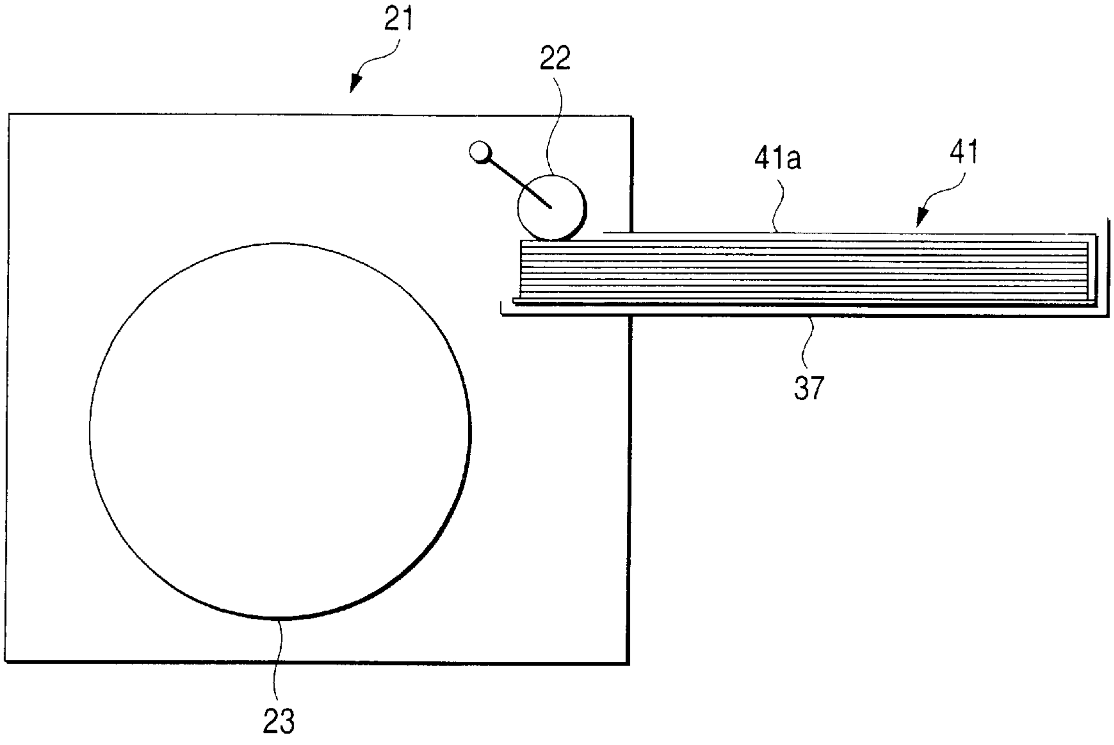
FIG. 1 is a diagram schematically showing the whole constitution of a recorder adequate for the recording method according to the present invention.

In these days of "computer to plate (CTP)", no film is needed any more and contract proofs are required as a substitute for proof sheets or analog color proofs. To gain customers' approval, it is needed to establish a high color reproducibility agreeing with printed matters or analog color proofs. In order to fulfill these requirements, there has been developed a DDCP system wherein pigment-type colorants similar to printing inks are employed and whereby images can be transferred onto paper without causing moires, etc. This DDCP system aims at establishing a large sized (A2/B2) digital direct color proof system with a high approximation to printed matters wherein pigment-type colorants similar to printing inks are employed and whereby images can be transferred onto paper. It is also intended to form an image having excellent qualities and a stable transfer density in case of laser-recording with the use of multibeam laser under different temperature/humidity conditions by: 1) using, as a thermal transfer sheet, a sheet not affected by illumination source in comparison with pigment colorants and printed matters and being excellent in the sharpness of dots and stability in transferring a colorant film; 2) using, as an image receptor layer, a sheet capable of stably and surely receiving the image receptor layer of the thermal transfer sheet; 3) enabling transfer to paper within the scope of 64 to 157 $g/m^2$ corresponding to art (coated) paper, mat paper, ultra light weight coated paper and the like and reproducing fine texture or exact paper whiteness (high key part); and 4) achieving an extremely stable transfer removability. Now, the total system thus developed will be illustrated involving greater detained description of the present invention.

The present invention is effective and adequate for a system of achieving a thermal transfer image consisting of sharp dots and being applicable to paper transfer and recording preferably in B2 size (515 mm×728 mm or above, B2 size: 543 mm×764 mm) still preferably 594 mm×841 mm or above.

This thermal transfer image is a dot image having a resolution of 2400 dpi or above (preferably 2600 dpi or above) appropriately determined depending on the number of printing lines. Individual dots have a sharp shape with little bleeding or defect. Thus, dots over a wide range from high-light to shadow can be clearly formed, which makes it possible to output rich dots at the same resolution as in image setters and CTP setters. Thus, dots and gradation highly approximating printed matters can be reproduced.

Because of having dots in sharp shape, this thermal transfer image can correctly reproduce dots corresponding to laser beams. Moreover, it has recording characteristics scarcely depending on the ambient temperature/humidity. Thus, a stable repeated reproducibility can be established both in hue and density over a wide range of ambient temperature/humidity conditions.

Because of being formed by using color pigments employed in printing inks and having a high repeated reproducibility, this thermal transfer image makes it possible to establish a highly accurate CMS (color management system).

Furthermore, the color hue of this thermal transfer image can almost agree with color hues of Japan Color, SWOP Color and the like, i.e., the color hues of printed matters. Moreover, it can show almost the same color changes as in printed matters under illumination with different light sources such as a fluorescent lamp or an incandescent lamp.

Owing to the sharp dot shape, this thermal transfer image can reproduce fine lines in extremely small characters. Heat generated by the laser beams is conducted to the transfer interface without diffusing in the plane direction. As a result, the image formation layer is sharply broken at the heated part/unheated part interface. Thus, film formation of the photothermal conversion layer and the physical properties of the image formation layer in the thermal transfer sheets are controlled.

In a simulation, it is estimated the photothermal conversion layer temperature instantaneously goes up to about 700° C. Therefore, a thin film frequently undergoes deformation or breakage. The deformation/breakage bring about a practical trouble that the photothermal conversion layer is transferred onto the image receptor sheet together with the image formation layer or the transferred image becomes uneven. To achieve a definite temperature, on the other hand, the film should contain a photothermal conversion substance at a high concentration. Thus, there arises another problem of the sedimentation of a colorant or migration thereof into the adjacent layer.

From this viewpoint, it is preferable to select an infrared-absorbing colorant and a heat-tolerant binder such as a polyimide binder to thereby make the photothermal conversion layer into a thin film of about 0.5 μm or below in thickness.

In case where the photothermal conversion layer is deformed or the image formation layer per se is deformed due to high temperature, the image formation layer transferred onto the image receptor layer shows an uneven thickness corresponding to the sub scanning pattern of the laser beams. As a result, the image also becomes uneven and the apparent transfer density is lowered. This tendency becomes more remarkable with a decrease in the thickness of the image formation layer. In case of a thick image formation layer, on the other hand, the sharpness of dots is worsened and the sensitivity is lowered too.

To fulfill these contrary requirements, it is preferable to relieve the unevenness in transfer by adding a low-melting substance such as a wax to the image formation layer. It is also possible to relieve the unevenness in transfer while sustaining the favorable dot sharpness and sensitivity by adding inorganic fine particles as a substitute for a binder to give an adequately elevated layer thickness, thereby ensuring sharp breakage of the image formation layer at the heated part/unheated part interface.

In general, low-melting substances such as wax are liable to ooze out on the image formation layer surface or crystallize and thus bring about problems in the image qualities or the stability of the thermal transfer sheets with the passage of time.

To solve these problems, it is preferable to use a low-melting substance having a small difference in the SP value from the polymer of the image formation layer. Thus the compatibility with the polymer can be elevated so as to prevent the separation of the low-melting substance from the image formation layer. It is also preferable to mix and co-melt together several types of low-melting substances having different structures to thereby prevent crystallization. As a result, an image having a sharp dot shape and little unevenness can be obtained.

Generally speaking, the coating layer of a thermal transfer sheet absorbs moisture and thus causes changes in the physical properties and thermal properties thereof. As a result, there arises humidity-dependency of the recording environment.

To lessen this temperature/humidity-dependency, it is preferable to use organic solvent systems as the colorant/binder system of the photothermal conversion layer and the binder system of the image formation layer. Moreover, it is preferable to select polyvinyl butylal as the binder in the image receptor layer and introduce a technique of making the polymer hydrophobic, thereby lowering the hygroscopicity. Examples of the technique of making the polymer hydrophobic involve a method of reacting a hydroxyl group with a hydrophobic group as reported by JPA 8-238858, a method of crosslinking two or more hydroxyl groups with the use of a film hardener and the like.

In the step of printing by laser-exposure, the image formation layer is usually heated to about 500° C. or above too and thus some of the conventionally employed pigments undergo thermal decomposition. This problem can be solved by employing highly heat-tolerant pigments in the image formation layer.

When an infrared-absorbing colorant migrates from the photothermal conversion layer to the image formation layer due to the heat in the printing step, the color hue is changed. To prevent this phenomenon, it is preferable to design the photothermal conversion layer with the combined use of an infrared-absorbing colorant with a binder having a high retention power as described above.

In high-speed printing, gaps corresponding to the laser sub scanning intervals are usually formed due to lack in energy. As discussed above, the heat generation/transduction efficiency can be elevated by forming the photothermal conversion layer and the image formation layer into thin films. To fill up the gaps and elevate the adhesiveness to the image receptor layer, it is still preferable to add a low-melting substance to the image formation layer so that the image formation layer is somewhat fluidized. To elevate the adhesiveness of the image receptor layer to the image formation layer and impart a sufficient strength to the transferred image, it is preferable to employ, for example, polyvinyl butylal as the binder in the image receptor layer, similar to the image formation layer.

It is preferable that the image receptor sheet and the thermal transfer sheets are maintained on a recording medium support member (preferably in the form of a rotary drum) by vacuum adhesion. This vacuum adhesion is important, since the image is formed by controlling the adhesive force between both sheets and thus the image transfer behaviors are highly sensitive in the clearance of the image receptor layer surface of the image receptor sheet and the image formation layer surface of the thermal transfer sheet. In case where the clearance between these materials is enlarged because of foreign materials such as dirt, there arise defects in the image or uneven image transfer.

To prevent such defects in the image or uneven image transfer, it is preferable to form regular projections on the thermal transfer sheets to thereby smoothen the air flow and achieve a uniform clearance.

Examples of the method commonly employed in forming projections on the thermal transfer sheets include post-treatments such as embossing and addition of a matting agent to the coating layer. The addition of a matting agent is preferable from the viewpoints of simplifying the production process and stabilizing the materials over a long time. The matting agent should have a size larger than the thickness of the coating layer. When a matting agent is added to the image formation layer, there arises a problem that the image in the parts where the matting agent exists falls off. It is therefore preferable to add a matting agent having an appropriate particle size to the photothermal conversion layer. Thus, the image formation layer per se has an almost uniform thickness and a defect-free image can be obtained on the image receptor sheet.

To ensure the reproduction of such sharp dots as discussed above, it is also required to precisely design a recorder. The recorder to be used herein fundamentally has the same constitution as conventionally employed laser thermal transfer recorders. Namely, this constitution is a so-called heat mode outer drum recording system wherein recording is performed by irradiating thermal transfer sheets and an image receptor sheet, which have been fixed on a rotary drum for recording, with a recording head provided with a plural number of high-power lasers. Among all, the following constitution may be cited as a preferable embodiment.

The image receptor sheet and the thermal transfer sheets are full-automatically fed from a recording medium cassette. The image receptor sheet and the thermal transfer sheets are fixed on the rotary drum for recording by vacuum adsorption. A large number of vacuum adsorption holes are formed on the rotary drum for recording and the inside of the drum is evacuated with a blower, a vacuum pump or the like. Thus the sheets are adsorbed onto the drum. Since the image receptor sheet is first adsorbed and then the thermal transfer sheets are further adsorbed thereon, the thermal transfer sheets have larger in size than the image receptor sheet. The air among the thermal transfer sheets and the image receptor sheet, which exerts the largest effect on the recording performance, is sucked off from the area of the thermal transfer sheets alone outside the image receptor sheet.

In this embodiment, a plural number of sheets having a large area (B2 size) can be superposed and assembled. Therefore, it is preferable to employ a system whereby air is jetted between each pair of these sheets so that the sheet fed later is lifted up.

Figure 2:
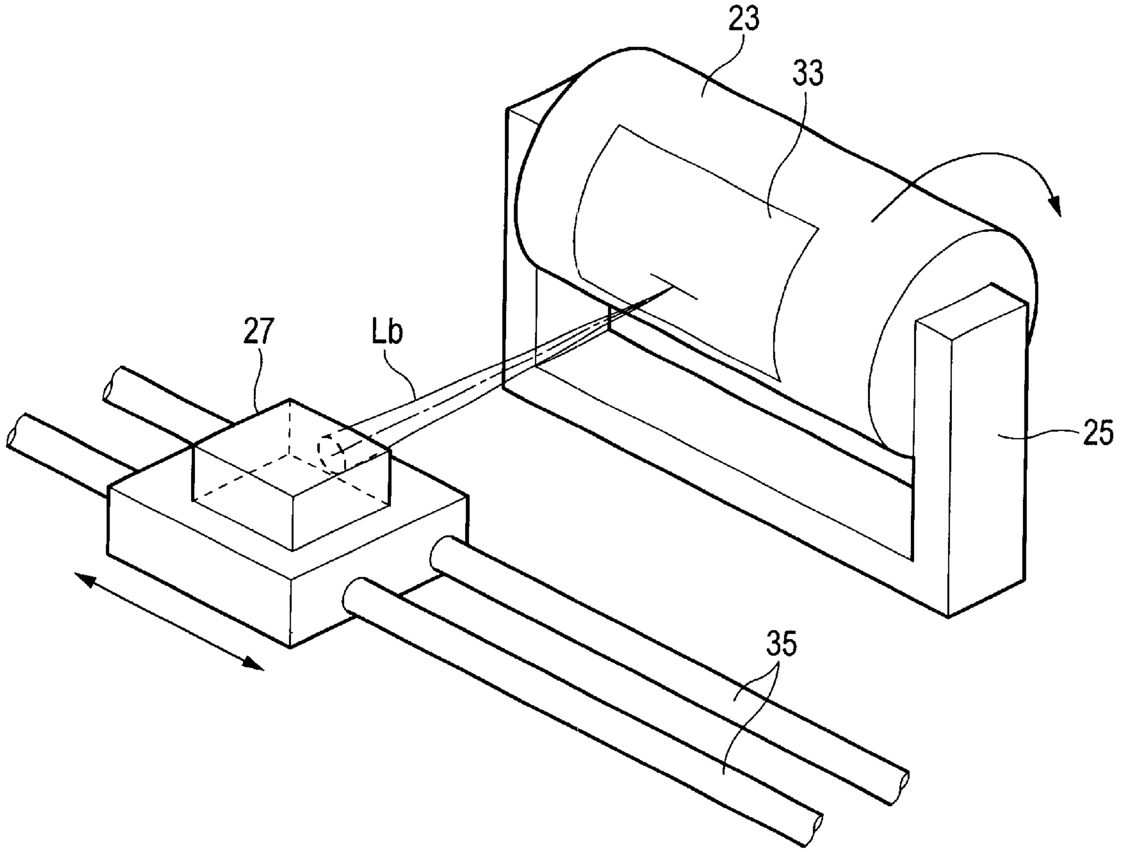
FIG. 2 is a diagram showing the constitution of the recording head unit of a recorder adequate for the recording method according to the present invention.

FIGS. 1 and 2 show an example of this constitution.

As FIGS. 1 and 2 show, a recording unit of a recorder 21 is provided with a rotary drum 23 for recording serving as a recording medium support member. The rotary drum 23 for recording, which is in the form of a hollow cylinder, is held in a rotatable state on a frame 25 shown in FIG. 2. In the recorder 21, the rotational direction of this rotary drum 23 for recording is referred to as the main scanning direction. The rotary drum 23 for recording is connected to the rotary shaft of a motor and thus driven by the motor.

The recording unit is further provided with a recording head 27 emitting laser beams Lb. At the position of a thermal transfer sheet 33 irradiated with the laser beams Lb, the image formation layer is transferred onto the surface of an image receptor sheet 31. The recording head 27 linearly shifts in the direction parallel to the rotary shaft of the rotary drum 23 for recording along a guide rail 35 by a driving mechanism, which is not shown in the figures. This shifting direction is referred to as the sub scanning direction. Therefore, a desired position on the thermal transfer sheet 33 covering the image receptor sheet 31 can be exposed to the laser beams by appropriately combining the rotational movement of the rotary drum 23 for recording and the linear shift of the recording head 27. Thus, a desired image can be transferred onto the image receptor sheet 31 by scanning the drawing laser beams Lb on the thermal transfer sheet 33 and exposing exclusively positions corresponding to the image data to the laser beams.

A cassette holder 37 is located on the recording medium setting unit of the recorder 21. A recording medium cassette 41 containing the recording media (i.e., image receptor sheet 31 and the thermal transfer sheets 33) is directly attached in a removable manner to this cassette holder 37. Since this recording medium cassette 41 is loaded on the cassette holder 37 in this recorder 21, the recording media are taken out from the recording medium cassette 41 and fed into the recording medium support member 23 of the recorder 21.

Figure 3:
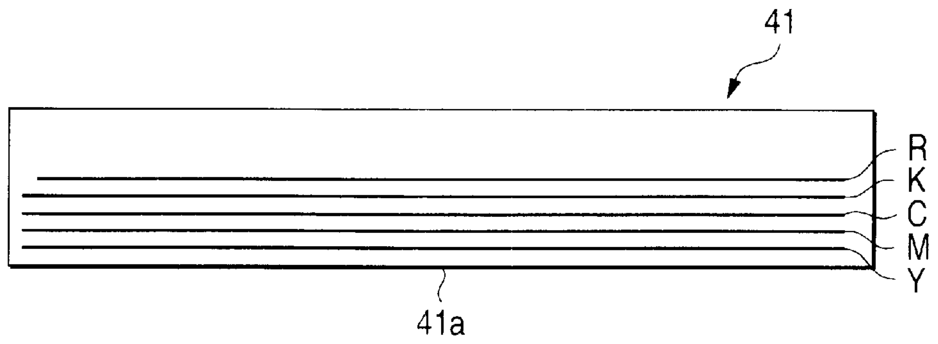
FIG. 3 is a sectional view of a simple cassette recording medium in a recorder adequate for the recording method according to the present invention.

FIG. 3 is a sectional view of the recording medium cassette. This recording medium cassette 41 contains the recording media including the image receptor sheet 31 and the thermal transfer sheets 33 laminated in the order of feeding into the rotary drum 23 for recording. In case of feeding the image receptor sheet R, a thermal transfer sheet K, a thermal transfer sheet C, a thermal transfer sheet M and a thermal transfer sheet Y in this order to the rotary drum 23 for recording, for example, these sheets are laminated in the order of RKCMY from top to bottom. From the simple cassette for recording medium attached to the recorder 21, the recording media are taken out from the uppermost layer with a pick up mechanism 22 provided in the recorder 21 and then fed into the recorder 21. Although the recording media are laminated at certain intervals in this figure, the recording media are laminated in contact with each other in practical case.

Since the recorder 21 has the cassette holder 37 in the cassette attachment unit, it is unnecessary any more to provide a space for containing the simple cassette for recording medium inside of the recorder 21. Thus, the recorder 21 can be down-sized.

It is preferable that the main body 41*a* of the recording medium cassette 4l is made of a metal. In case of using a metallic main body 41*a* of the cassette, static electricity, which would be generated when the laminated recording media shift upon transportation, can be discharged toward the metallic main body 41*a*. Thus, static adsorption can be prevented and, in its turn, the phenomenon of feeding a plural number of sheets at the same time due to adhesion can be avoided in the step of taking out the recording medium.

In case of using a main body 41*a* of the cassette made of cardboard, the material cost can be reduced. Since such a main body can be produced at a lower cost, the production cost can be reduced too. Moreover, use can be made of reclaimed paper therefor, which contributes to the effective utilization of resources and lessens undesirable effects on the environment.

Although the recording medium cassette 41 has a low strength, it can be stably and surely fixed to the recorder 21 by locating on a rigid cassette holder 37. It is therefore possible to use a recording medium cassette 41 made of a material having relatively low strength such as cardboard or plastics.

Figure 4:
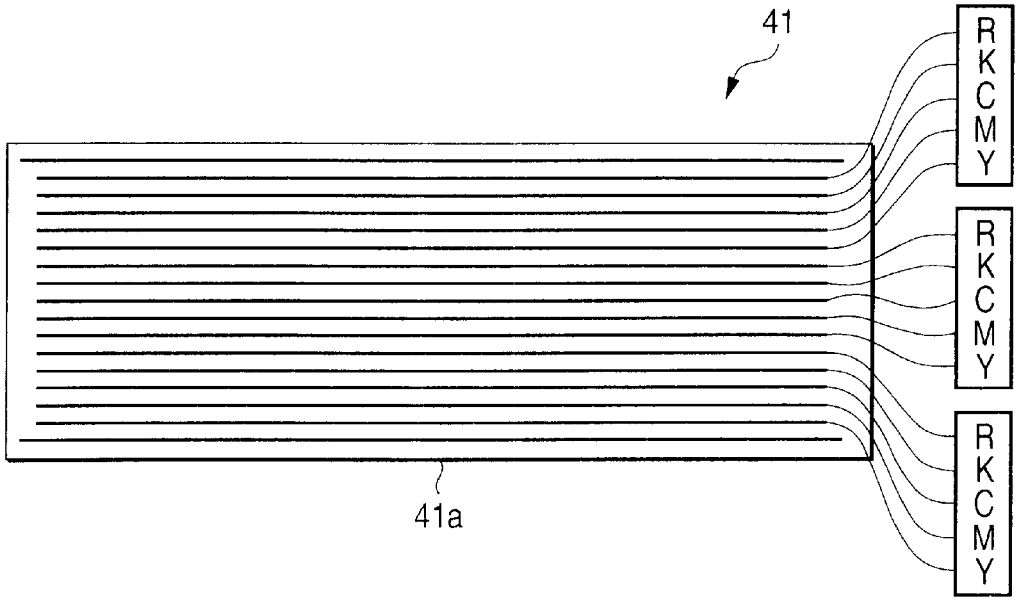
FIG. 4 is a diagram illustrating the lamination form of a plural number (3 in this case) of recording medium sets each having recording media laminated in the order of feeding into a rotary drum for recording.
Figure 5:
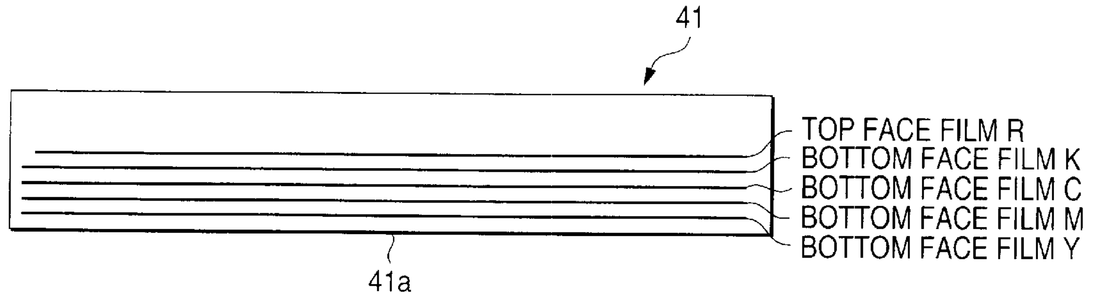
FIG. 5 is a diagram showing a case wherein an image receptor layer (film R) is located upward while image formation layers (films K, C, M and Y) are located downward.
Figure 6:
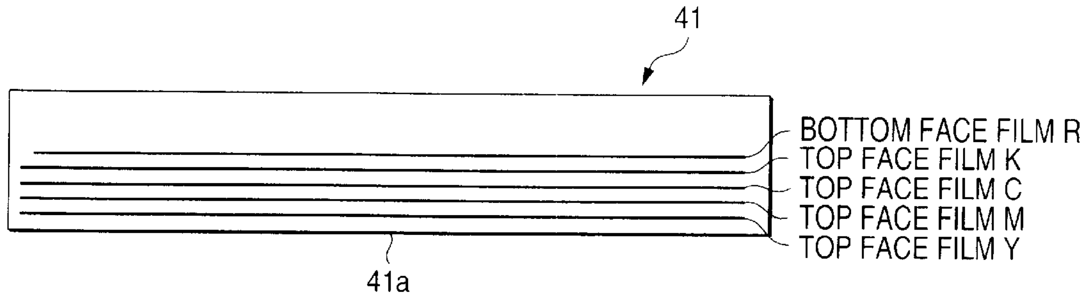
FIG. 6 is a diagram showing another case wherein an image receptor layer is located downward while image formation layers are located upward.

As FIG. 4 shows, a plural number of recording medium sets (three sets in this case), each having the recording media RKCMY laminated in the order of feeding into the rotary drum 23 for recording, may be superposed in the recording medium cassette 41. The number of these sets is an integer. The order of laminating the recording media in each set (i.e., the recording order) is exemplified by RKYMC, RYMCK, RCMYK and the like. It is essentially required that R is the first.

The recording media to be contained in the recording medium cassette 41 is laminated in such a manner that the image receptor layer of the image receptor sheet 31 is located in the direction opposite to the image formation layers of the thermal transfer sheets 33. That is to say, there are a case wherein the image receptor layer (the face of film R) is located upward while the image formation layers (the faces of films K. C, M and Y) are located downward, and another case wherein the image receptor layer is located downward while the image formation layers are located upward.

Figure 7:
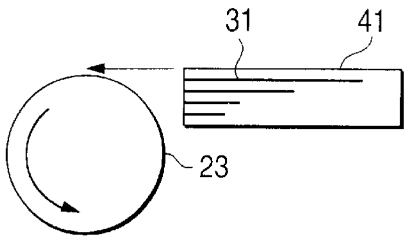
FIG. 7 is a diagram illustrating the direction of feeding recording media into a rotary drum for recording.
Figure 7:
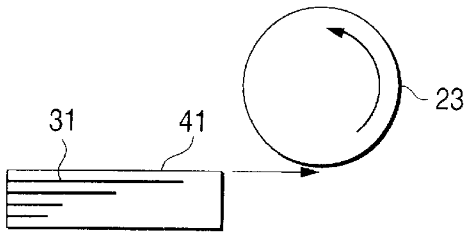

In the case where the image receptor layer is located upward while the image formation layers are located downward, the recording media are fed along the upper periphery of the rotary drum 23 for recording as shown in FIG. 7(*a*). Thus, the image receptor sheet 31 serving as the uppermost layer is first fixed to the rotary drum 23 for recording. Subsequently, the thermal transfer sheets 33 are fed into the rotary drum 23 for recording and thus the image formation layers of the thermal transfer sheets 33 are superposed on the image receptor layer of the image receptor sheet 31.

In case where the image receptor layer is located downward while the image formation layers are located upward, on the other hand, the recording media are fed along the lower periphery of the rotary drum 23 for recording as shown in FIG. 7(*b*). Thus, the image receptor sheet 31 serving as the uppermost layer is first fixed to the rotary drum 23 for recording. Subsequently, the thermal transfer sheets 33 are fed into the rotary drum 23 for recording and thus the image formation layers of the thermal transfer sheets 33 are superposed on the image receptor layer of the image receptor sheet 31.

Figure 8:
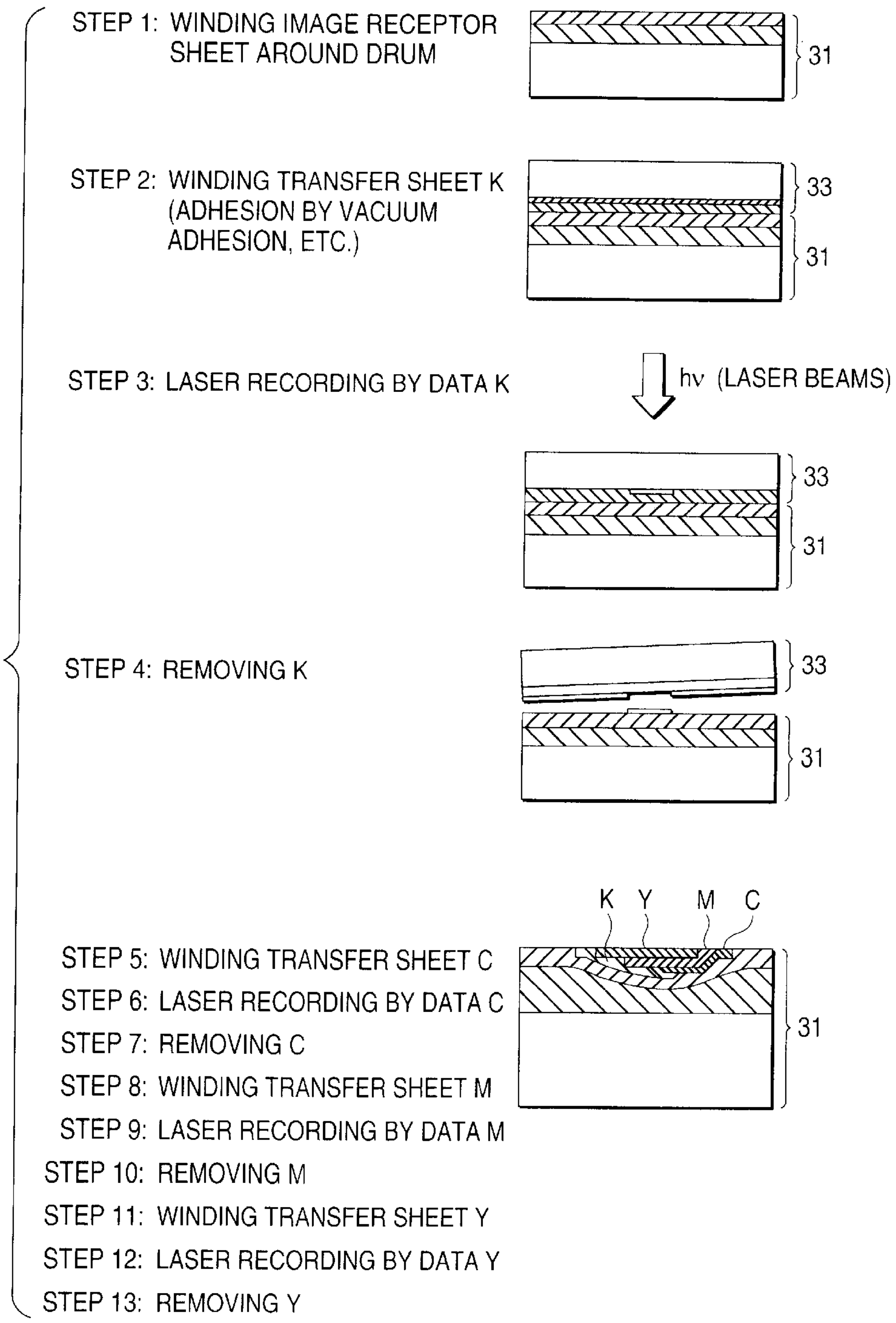
FIG. 8 is a diagram showing the recording procedure on recording media.

Next, the procedure of taking out the image receptor sheet and the thermal transfer sheets K, C, M. Yin four colors contained in the recording medium cassette and forming a desired color image on the image receptor sheet 31 will be described by reference to FIG. 8.

As FIG. 1 shows, the recording medium cassette 41 is attached to the recorder 21 and then the pick up mechanism 22 is driven. Thus, the image receptor sheet 31 serving as the uppermost layer is fed into the rotary drum 23 for recording as shown in step 1 in FIG. 8.

In the next step 2, the thermal transfer sheet K is fed into the rotary drum 23 for recording.

Subsequently, the thermal transfer sheet 33 is laminated by heating under elevated pressure. This lamination step is omitted in some cases.

Figure 11:
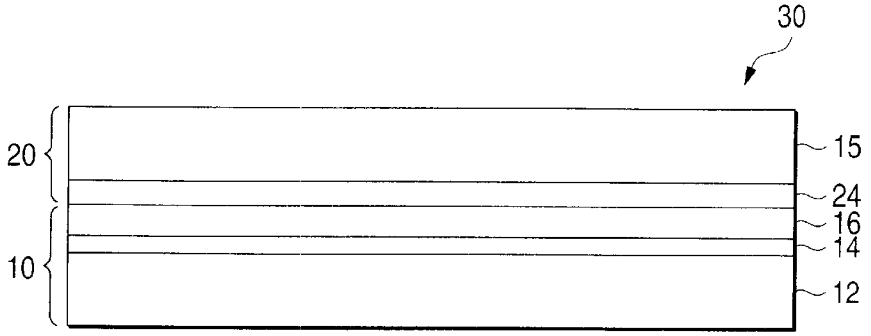
FIGS. 11 (11(*a*), 11(*b*) and 11(*c*)) is a diagram schematically illustrating the image formation mechanism by film thermal transfer using laser.
Figure 11:
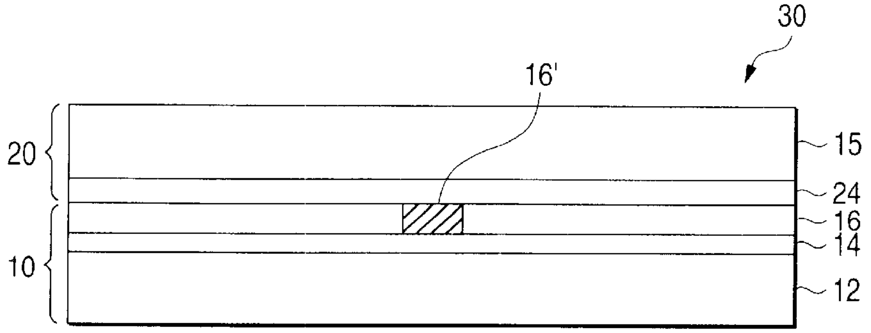
Figure 11:
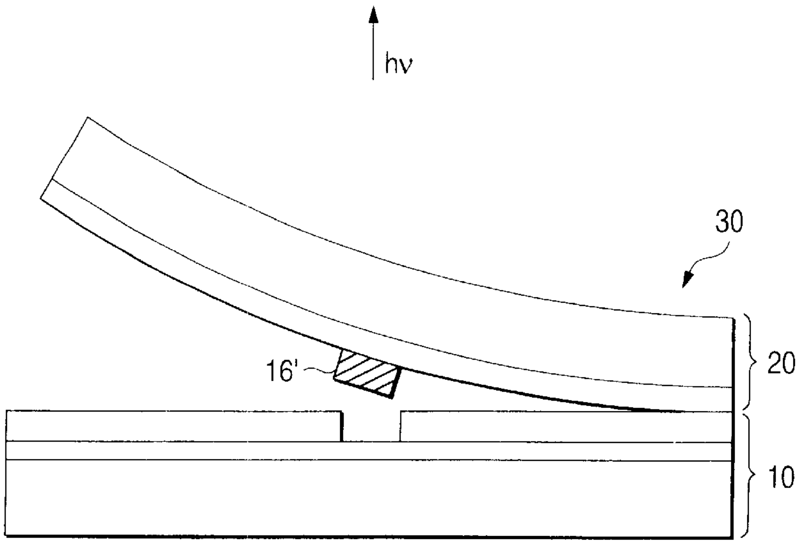

In the next step 3, an image is transferred and output onto the image receptor sheet 31 based on image data supplied preliminarily. The supplied image data are separated into images of individual colors. The laser exposure is carried out depending on the image data of each color thus separated. Consequently, the image formation layer of the thermal transfer sheet 33 is transferred onto the image receptor sheet 31 and an image is formed on the image receptor sheet 31. The detailed mechanism of the image formation whereby the image formation layer of the thermal transfer sheet is transferred onto the image receptor layer of the image receptor sheet due to the laser exposure will be illustrated later (FIG. 11).

In step 4, the thermal transfer sheet (K) 33 alone is removed from the rotary drum 23 for recording. Then it is confirmed whether or not the color images on all of the thermal transfer sheets 33 have been transferred. In case of needing to feed a thermal transfer sheet 33 of another type, the procedures of the above-described steps 2 to 4 are repeated. That is to say, the procedures of steps 2 to 4 are repeated for each of the other thermal transfer sheets C, M and Y (steps 5 to 13). As a result, the images KCMY on the thermal transfer sheets 33 in four colors are transferred onto the image receptor sheet 31 and thus a color image is formed on the image receptor sheet 31.

Next, the image receptor sheet 31 is removed from the rotary drum 23 for recording. The image having been transferred onto image receptor sheet 31 thus removed is then further transferred onto an arbitrary printing paper in an image transfer unit provided separately. Thus color printing for proofing is carried out.

By preparing a package containing the image receptor sheet and the thermal transfer sheets having been laminated in the order of feeding into the rotary drum 23 for recording packed therein, the recording media can be set, as contained in the main body 41*a* of the cassette, into the recorder 21 at once after opening the package. It is favorable since the procedure of manually setting the recording media one by one can be thus omitted. As a result, the adhesion of foreign materials to the recording media can be lessened and defects in the image due to foreign materials can be relieved. It is also possible to prevent mistaken color recording order due to an error in manual operation. In addition, a plural number of recording media can be set at once, which contributes to labor-saving in the operation of feeding the recording media.

Figure 9:
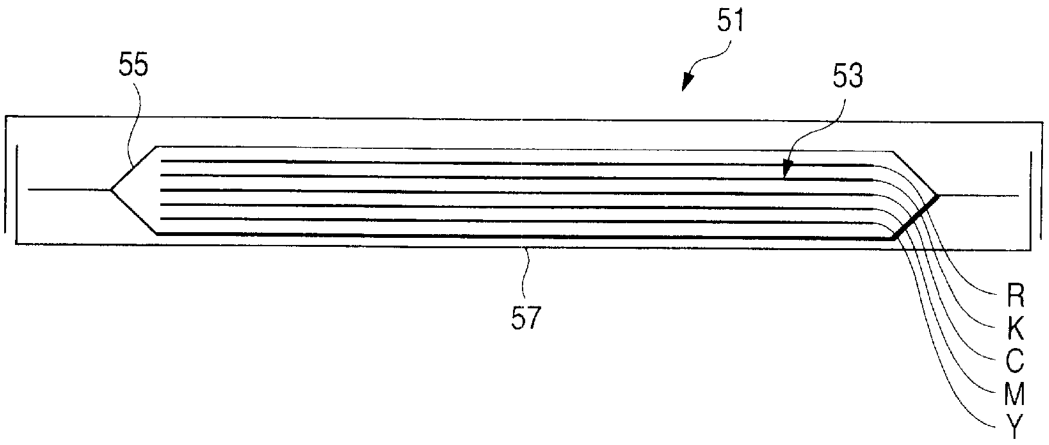
FIG. 9 is a diagram showing the constitution of a package of recording media.
Figure 10:
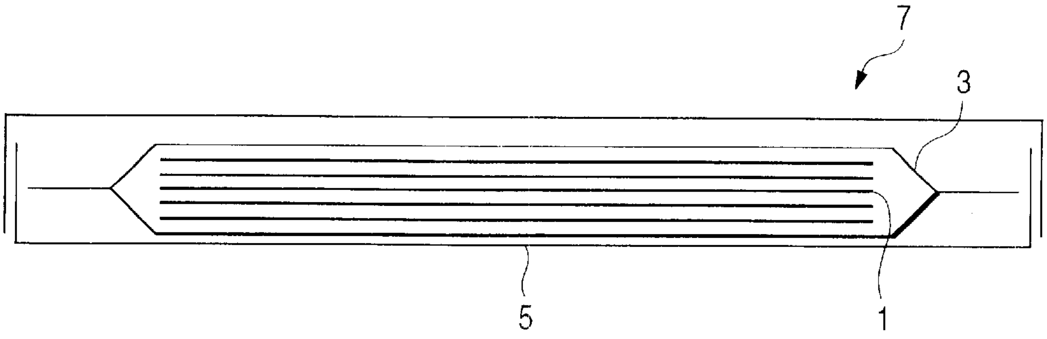
FIG. 10 is a sectional view of an existing package of recording media.

FIG. 9 shows an example of such a package. In case where the recording media are fed into the rotary drum for recording 15 in the order of R (image receptor sheet), K (black thermal transfer sheet), C (cyan thermal transfer sheet), M (magenta thermal transfer sheet) and Y (yellow thermal transfer sheet), for example, the recording media 53 are laminated in the order of RKCMY from top to bottom.

The recording media 53 thus laminated are vacuum-packaged in a packaging material 55 such as a synthetic resin bag made of, for example, polyethylene and further packed in a decorative box 57 made of corrugated fiberboard or the like to give a package 51. Although the recording media 53 are laminated at certain intervals in this figure, the recording media 53 are laminated in contact with each other in practical case. The order of laminating the recording media 53 (i.e., the recording order) is exemplified by RKYMC, RYMCK, RCMYK and the like. It is essentially required that R is the first.

The recorder 21 as described above further exerts the following effects.

Since the image receptor sheet 31 is located as the uppermost layer, the image receptor sheet 31 of the top layer is first fed into the rotary drum 23 for recording. Namely, the image receptor sheet 31, which should be fixed first to the rotary drum 23 for recording, can be always fed first. Therefore, the thermal transfer sheets 33 of individual colors can be selectively superposed on the image receptor sheet 31 which has been fixed to the rotary drum 23 for recording.

In case of laminating a plural number of recording medium sets, a plural number of the recording medium sets can be set into the recorder 21 at the same time. That is to say, the image receptor sheet 31 of the first set is fixed to the rotary drum 23 for recording and then recording is carried out by the thermal transfer sheets 33 of individual colors. When the image receptor sheet 31 of the first set on which recording has been completed is discharged, the image receptor sheet 31 of the second set is fixed again to the rotary drum 23 for recording. Then recording is carried out on this image receptor sheet 31 by the thermal transfer sheets 33 of individual colors. After setting the fist set, namely, recording can be made without setting the recording media any more. Thus, color images in the same number of the set number can be formed without manually setting the recording media. Thus, the steps of setting the recording media can be reduced, thereby saving labor.

Since the image receptor layer of the image receptor sheet is located in the direction opposite to the image formation layers of the thermal transfer sheets 33, the image receptor layer and the image formation layers can be superposed without turning over either the image receptor sheet 31 or the thermal transfer sheets in the course of transporting the image receptor sheet 31 and the thermal transfer sheets 33. As a result, the recording media can be quickly fed in the step of feeding and transporting the recording media. In case of laminating a plural number of recording medium sets in the recording medium cassette 41, the image receptor sheets 31 are provided in such a manner that the image receptor layers 31 are all in the same direction, while the thermal transfer sheets 33 are laminated in such a manner that the image formation layers are all in the same direction.

Since the recording medium cassette 41 is attached to the recorder 21 in a directly removable manner, it is unnecessary to set the recording media in a cassette as in existing devices. Namely, the sets having the recording media laminated in the order of feeding can be set in a one-touch operation. Thus, the adhesion of foreign materials to the recording media can be relived and color recording order errors can be avoided. Furthermore, the labor in feeding the recording media can be largely saved thereby.

From the viewpoints of lessening the adhesion of foreign materials and maintaining the transport of sheets in a favorable state, it is preferable to use a pressure-sensitive adhesive roll having a pressure-sensitive adhesive material in some part of the transport roller commonly employed in the thermal transfer sheet and image receptor sheet feeding member of the transporting member.

Using the pressure-sensitive adhesive roll, the surface of the thermal transfer sheets and the image receptor sheet can be cleaned.

Examples of the pressure-sensitive adhesive material to be provided on the surface of the pressure-sensitive adhesive roll include ethylene-vinyl acetate copolymer, ethylene-ethyl acrylate copolymer, polyolefin resin, polybutadiene resin, styrene-butadiene rubber (SBR), styrene-ethylene-butene styrene copolymer (SEBS), acrylonitrile-butadiene rubber (NBR), polyisoprene resin (IR), styrene-isoprene copolymer (SIS), acrylic acid ester copolymer, polyester resin, polyurethane resin, acrylic resin, butyl rubber and polynorbornene.

The pressure-sensitive adhesive roll comes into contact with the surface of the thermal transfer sheets and the image receptor sheet and thus cleans the surface. The contact pressure thereof is not particularly restricted, so long as it is in contact with the surface.

It is preferable that the pressure-sensitive adhesive material to be used in the pressure-sensitive adhesive roll has a Vickers hardness Hv of 50 kg/mm$^2$ (≈490 MPa) or below from the viewpoint of sufficiently eliminate dirt (i.e., foreign materials) and regulate defects in the image.

The term Vickers hardness means the hardness measured by indenting the test material with a diamond indenter, in the form of a right pyramid with a square base and an angle of 136 degrees between opposite faces subjected to a static load. Vickers hardness is determined in accordance with the following formula.

$$\text{Hardness } Hv = 1.854\ P/d^2\ (\text{kf/mm}^2) \approx 18.1692\ P/d^2\ (\text{MPa}).$$

In the above formula, P stands for the load (kg); and d stands for distance (mm) between opposite angles of the square in the recess.

In the present invention, it is also preferable that the pressure-sensitive adhesive material to be used in the pressure-sensitive adhesive roll has a modulus of elasticity at 20° C. of 200 kg/mm$^2$ (≈19.6 MPa) or below from the viewpoint of sufficiently eliminate dirt (i.e., foreign materials) and regulate defects in the image as described above.

It is preferable that the absolute difference between the surface roughness Rz of the image formation layer surface of the thermal transfer sheet and the surface roughness Rz of the back layer surface thereof is 3.0 or below and the absolute difference between the surface roughness Rz of the image receptor layer surface of the image receptor sheet and the surface roughness Rz of the back layer thereof is 3.0 or below. Owing to this constitution and the above-described cleaning means, defects in the image can be prevented, jamming in transportation can be avoided and, furthermore, the dot gain stability can be improved.

The term "surface roughness" as used in this description means an average surface roughness evaluated in 10-grades corresponding to Rz (maximum height) in JIS. Namely, using the average face obtained by withdrawing the standard area from the curved rough face as a standard, the distance between the average height of from the highest crest to the 5th one and the average depth of from the deepest root to the 5th one is input and converted. To measure the surface roughness, use is made of a three-dimensional roughness meter of the stylus type (Surfcom 570A-3DF) manufactured by Tokyo Seimitsu K.K. The measurement is carried out in the longitudinal direction at cutoff of 0.08 mm, measurement area of 0.6×0.4 $mM^2$, feeding pitch of 0.005 mm and measuring speed of 0.12 mm/sec.

To further improve the above-described effects, it is still preferable that the absolute difference between the surface roughness Rz of the image formation layer surface of the above-described thermal transfer sheet and the surface roughness Rz of the back layer surface thereof is 1.0 or below and the absolute difference between the surface roughness Rz of the image receptor layer surface of the image receptor sheet and the surface roughness Rz of the back layer thereof is 1.0 or below.

It is also preferable that the glossiness of the image formation layer of the thermal transfer sheet is from 80 to 99.

The glossiness largely depends on the smoothness of the image formation layer and affects the uniformity in the image formation layer thickness. An image formation layer having a higher glossiness has the higher uniformity and thus is more adequate for forming a fine image. However, a higher smoothness results in the larger resistance during transportation. That is, there is a trade-off between these factors. When the glossiness ranges from 80 to 99, both of these factors can be established in a well-balanced state.

Next, the mechanism of forming a multicolor image by film thermal transfer with the use of laser will be roughly illustrated by reference to FIG. 11.

An image formation laminate 30 composed of an image receptor sheet 20 laminated on the surface of an image formation layer 16 containing a black (K), cyan (C), magenta (M) or yellow (Y) pigment is prepared. A thermal transfer sheet 10 has a substrate 12, a photothermal conversion layer 14 provided thereon, and the image formation layer 16 further provided thereon. The image receptor sheet 20 has a substrate 15 and an image receptor layer 24 provided thereon. On the surface of the image formation layer 16 of the thermal transfer sheet 10, the image receptor layer 24 is laminated in contact therewith (FIG. 11(*a*)). Then the laminate 30 is irradiated with laser beams corresponding to an image in time series from the side of the substrate 12 of the thermal transfer sheet 10 of the laminate 30. Thus, the laser-irradiated part of the photothermal conversion layer 14 of the thermal transfer sheet 10 generates heat and suffers from a decrease in the adhesion force to the image formation layer 16 (FIG. 11(*b*)). Next, the image receptor sheet 20 is removed from the thermal transfer sheet 10. Thus, the laser-irradiated region 16' in the image formation layer 16 is transferred onto the image receptor layer 24 of the image receptor sheet 20 (FIG. 11(*c*)).

In forming a multicolor image, it is preferable to use multibeam, in particular, two-dimensionally arranged multibeam, as the laser beams to be used in the irradiation. The term two-dimensionally arranged multibeam means a two-dimensional planar arrangement wherein a plural number of laser beams are used in the laser irradiation and the spots of these laser beams are arranged in such a manner as giving a plural columns along the main scanning direction and a plural rows along the sub scanning direction.

Using laser beams with the two-dimensionally arranged multibeam, the laser recording time can be shortened.

The laser beams to be used herein are not particularly restricted so long as being multibeam. Namely, use can be made of gas laser beams such as argon ion laser beams, helium neon laser beams and helium cadmium laser beams, solid laser beams such as YAG laser beams, and direct laser beams such as semiconductor laser beams, colorant laser beams and eximer laser beams. Alternatively, use can be made of beams obtained by converting the above-described laser beams into half wave length through a secondary harmonic element. It is preferable to use semiconductor laser beams in the present invention from the viewpoints of output power, easiness in modulation, etc. In the present invention, it is preferable that the laser irradiation is carried out under such conditions as giving a beam diameter on the photothermal conversion layer of from 5 to50 $\mu$m (still preferably from 6 to 3 $\mu$m). It is also preferable that the scanning speed is 1 m/sec or above (still preferably 3 m/sec or above).

In the image formation, it is preferable that the thickness of the image formation layer in the black thermal transfer sheet exceeds the image formation layer thicknesses of the yellow, magenta and cyan thermal transfer sheets and ranges from 0.5 to 0.7 $\mu$m. Owing to this design, a decrease in the density caused by uneven transfer can be prevented in the step of laser-irradiation of the black thermal transfer sheet.

In case where the image formation layer thickness of the above-described black thermal transfer sheet is less than 0.5 $\mu$m, the image density is largely lowered by uneven transfer and, therefore, it sometimes becomes impossible to achieve an image density required as a printing proof. Since this tendency becomes more remarkable under a high humidity, a large change in density arises depending on the environment in some cases. In case where the above-described layer thickness exceeds 0.7 $\mu$m, on the other hand, the transfer sensitivity is lowered in the laser recording. As a result, it is sometimes observed that small spots cannot adhere well or fine lines become thinner. This tendency becomes more remarkable under a low humidity. Moreover, the resolution power is sometimes worsened. It is still preferable that the image formation layer thickness of the above-described black thermal transfer sheet is from 0.55 to 0.65 $\mu$m, particularly preferably 0.60 $\mu$m.

Furthermore, it is preferable that the thickness of the image formation layer of the above-described black thermal transfer sheet is from 0.5 to 0.7 $\mu$m and the image formation layer thickness of each of the above-described yellow, magenta and cyan thermal transfer sheets is 0.2 $\mu$m or more but less than 0.5 $\mu$m.

In case where the image formation layer thickness of each of the above-described yellow, magenta and cyan thermal transfer sheets is less than 0.2 $\mu$m, the density is lowered due to uneven transfer in the step of laser recording. In case where the layer thickness exceeds 0.5 μm, on the other hand, there sometimes arises a decrease in the transfer sensitivity or worsening in the resolution power. It still preferably ranges from 0.3 to 0.45 μm.

It is preferable that the image formation layer of the above-described black thermal transfer sheet contains carbon black. This carbon black is preferably a mixture of at least two types of carbon blacks having different coloring powers, since the reflective optical density can be controlled thereby while maintaining the P/B (pigment/binder) ratio within a specific range.

The coloring power of carbon black may be expressed in various ways. For example, PVC blackness level reported in JPA 10-140033 and the like may be cited. The PVC blackness level is determined by adding carbon black to PVC resin, dispersing it with a twin-screw roller to make a sheet, and then evaluating the blackness level of the sample with the naked eye based on the blackness levels of Carbon Blacks "#40" and "#45" manufactured by Mitsubishi Chemical referred to respectively as 1 and 10 scores. Two or more carbon blacks having different PVC blackness levels can be appropriately selected and employed depending on the purpose.

Next, a specific example of a method of preparing a sample will be illustrated.

Method of Preparing Sample

40% by mass of a sample carbon black is added to an LDPE (low-density polyethylene) resin and kneaded at 115° C. for 4 minutes in a 2500 cc Banbury mixer.

Composing conditions:

| | |
|---|---|
| LDPE resin | 101.89 g |
| calcium stearate | 1.39 g |
| Irganox 1010 | 0.87 g |
| sample carbon black | 69.43 g |

Next, the mixture is diluted at 120° C. in a twin-screw roll mill until the carbon black concentration amounts to 1% by mass. Diluted compound preparation conditions:

| | |
|---|---|
| LDPE resin | 58.3 g |
| calcium stearate | 0.2 g |
| resin containing 40% by mass of carbon black | 1.5 g |

Then the mixture is formed into a sheet at a slit width of 0.3 mm and the obtained sheet is cut into chips. Next, a film of 65±3 μm is formed on a hot plate at 240° C.

To form a multicolor image, a large number of image layers (image formation layers each having an image formed thereon) may be repeatedly superposed on a single image receptor sheet with the use of the above-described thermal transfer sheets to thereby form a multicolor image as described above. Alternatively, a multicolor image may be formed by forming images on the image receptor layers of a plural number of image receptor sheets and then retransferring the images onto printing paper or the like.

In the latter case, thermal transfer sheets having image formation layers containing colorants having different color hues from each other are prepared and respectively combined with image receptor sheets so as to give four types (four colors: cyan, magenta, yellow and black) of laminates independently. Then each laminate is irradiated with laser beams corresponding to digital signals based on an image via, for example, a color separation filter. Subsequently, the thermal transfer sheets are removed from the image receptor sheets. Thus a color separation image of each color is independently formed on each image receptor sheet. Then the thus obtained color separation images are successively laminated on a practical substrate such as printing paper or a similar substrate prepared separately. Thus, a multicolor image can be formed.

In the thermal transfer recording with the use of laser irradiation, laser beams are converted into heat and an image formation layer containing a pigment is transferred onto an image receptor sheet with the use of the heat energy to thereby form an image on the image receptor sheet. Thus, the pigment, colorant and image formation layer may be in an arbitrary state such as solid, softened, liquid or gaseous state, preferably a solid or softened state, in the step of transfer. The thermal transfer recording with the use of laser irradiation includes, for example, melt transfer, abbration transfer, sublimation transfer, etc. conventionally known in the art.

Among all, the above-described film transfer, melt transfer and abbration transfer are favorable from the viewpoint that images having color hues similar to printed matters can be obtained thereby.

To transfer the image receptor sheet having an image printed by the recorder onto a printing paper (hereinafter referred to as "paper"), a heat laminator is usually employed. By applying heat and pressure to the image receptor sheet superposed on the paper, these sheets adhere to each other. Then the image receptor sheet is removed from the paper. Thus, the image receptor layer having the image alone remains on the paper.

By connecting the above-described recorder to a platemaking system, a system exerting a color proofing function can be constructed. In this system, a print having image qualities as close as possible to the printed matter output from the plate making data should be output from the above-described recorder. Therefore, a software for approximating the colors and dots to the printed matter is needed. Next, a specific example of the connection will be given.

To take a proof from a printed matter obtained by a plate making system (for example Celebra manufactured by Fuji Photofilm), the system is constructed as follows. A CTP (computer to plate) is connected to the plate making system. An output printing plate is fed into the printer to give a final printed matter. The above-described recorder is connected to the plate making system as a color proof. As a proof drive software, PD System® is connected between them.

The contone (continuous) data converted into luster data in the plate making system are converted into binary data for dots and output to the CTP system followed by printing. On the other hand, the same contone data are output into the PD system too. By the PD system, the received data are converted by a four-dimensional (black, cyan, magenta and yellow) table so that the colors in the print match with the colors in the above-described printed matter. Finally, the data are converted into binary data so as to agree with the dots in the above-described printed matter and then output to the recorder.

The above-described four-dimensional table is preliminarily formed experimentally and stored in the system. The experiment for the formation thereof is as follows. Namely, an image obtained by printing important color data via the CTP system and another image output from the recorder via the PD system are prepared and the color measurement values are compared. Thus the table is prepared so as to give the minimum difference.

Next, the thermal transfer sheet and the image receptor sheet appropriately usable in the recorder of the above-described system will be described.

[Thermal Transfer Sheet]

The thermal transfer sheet has at least a photothermal conversion layer and an image formation layer on a substrate optionally together with other layers, if needed.

(Substrate) The substrate of the thermal transfer sheet may be made of any materials without restriction. Various substrate materials may be used depending on the purpose. It is preferable that the substrate has a favorable rigidity and a high dimensional stability and can withstand the heat upon image formation. Preferable examples of the substrate material include synthetic resins such as polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymer, polyamide (aromatic or aliphatic), polyimide, polyamidoimide, polysulfone, etc. Among all, it is preferable to use biaxially oriented polyethylene terephthalate from the viewpoints of mechanical strength and dimensional stability upon heating. In case of using in the formation of a color proof with the use of laser recording, it is preferable that the substrate of the thermal transfer sheet is made of a transparent synthetic resin material permeable to laser beams. The thickness of the substrate preferably ranges from 25 to 130 μm, still preferably from 50 to 120 μm. It is preferable that the center line average surface roughness Ra (measured in accordance with JIS B0601 with, for example, a surface roughness meter Surfcom manufactured by Tokyo Seiki) of the substrate in the image formation layer side is less than 0.1 μm. It is preferable that Young's modulus in the length direction of the substrate is from 200 to 1200 $kg/mm^2$ (≈2 to 12 GPa) while Young's modulus in the width direction thereof is from 250 to 1600 $kg/mm^2$ (≈2.5 to 16 GPa). The F-5 value in the length direction of the substrate preferably ranges from 5 to 50 $kg/mm^2$ (≈49 to 490 MPa), while the F-5 value in the width direction of the substrate preferably ranges from 3 to 30 $kg/mm^2$ (≈29.4 to 294 MPa). Although the F-5 value in the length direction of the substrate is generally higher than the F-5 value in the width direction of the substrate, the present invention is not restricted thereto particularly in case where the strength in the width direction should be elevated. The heat compressibility in the length direction of the substrate is preferably 3% or below, still preferably 1.5% or below at 100° C. for 30 minutes and 1% or below, still preferably 0.5% or below at 80° C. for 30 minutes. It is also preferable that the break strength is from 5 to 100 $kg/mm^2$ (≈490 to 980 MPa) in both directions and the modulus of elasticity is from 100 to 2000 $kg/mm^2$ (≈0.98 to 19.6 GPa).

To improve the adhesiveness to the photothermal conversion layer formed thereon, the substrate of the thermal transfer sheet may be subjected to a surface activation treatment and/or provided with one or more undercoat layers. Examples of the surface activation treatment include glow discharge, corona discharge, etc. As the material of the undercoat layers, it is preferable to employ one having a high adhesiveness to both of the substrate and photothermal conversion layer faces, showing a low heat conductivity and being excellent in heat tolerance. Examples of such undercoat layer materials include styrene, styrene-butadiene copolymer, gelatin, etc. The total thickness of the undercoat layer(s) usually ranges from 0.01 to 2 μm. If needed, the surface of the thermal transfer sheet in the opposite side to the face having the photothermal conversion layer thereon may be provided with layers with various functions such as an antireflective layer or an antistatic layer or subjected to a surface treatment.

(Back Layer)

It is preferable to form a back layer on the surface in the opposite side to the face having the photothermal conversion layer formed thereon of the thermal transfer sheet according to the present invention. It is preferable that the back layer is composed of two layers, i.e., a first back layer adjacent to the substrate and a second layer provided in the opposite side of the first back layer to the substrate. In the present invention, it is preferable that the ratio (B/A) of the mass B of an antistatic agent contained in the second back layer to the mass A of the antistatic agent contained in the first back layer is less than 0.3. IN case where the ratio B/A is 0.3 or more, there is observed a tendency that the slipperiness and powder fall-out from the back layers are worsened.

The thickness C of the first back layer preferably ranges from 0.01 to 1 μm, still preferably from 0.01 to 0.2 μm. The thickness D of the second back layer preferably ranges from 0.01 to 1 μm, still preferably from 0.01 to 0.2 μm. The thickness ratio (C:D) between the first and second layers preferably ranges from 1:2 to 5:1.

As the antistatic agents employed in the first and second back layers, use can be made of nonionic surfactants such as polyoxyethylene alkylamine and glycerol fatty acid esters, cationic surfactants such as quaternary ammonium salts, anionic surfactants such as alkyl phosphates, amphoteric surfactants, electrically conductive resins and so on.

It is also possible to use electrically conductive fine grains as the antistatic agent. Examples of such electrically conductive fine grains include oxides such as ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfides such as CuS and ZnS; carbides such as SiC, TiC, ZrC, VC, NbC, MoC and WC; nitrides such as $Si_3N_4$, TiN, ZrN, VN, NbN and $Cr_2N$; borides such as $TiB_2$, $ZrB_2$, $NbB_2$, $TaB_2$, CrB, MoB, WB and $LaB_5$; suicides such as $TiSi_2$, $ZrSi_2$, $NbSi_2$, $TaSi_2$, $CrSi_2$, $MoSi_2$ and $WSi_2$; metal salts such as $BaCO_3$, $CaCO_3$, $SrCO_3$, $BaSO_4$ and $CaSO_4$; and complexes such as $SiN_4$—SiC and $9Al_2O_3$-$2B_2O_3$. Either one of these compounds or a combination of two or more thereof may be used. Among all, $SnO_2$, ZnO, $Al_2O_3$, $TiO_2$, $In_2O_3$, MgO, BaO and $MoO_3$ are preferable, $SnO_2$, ZnO, $In_2O_3$ and $TiO_2$ are still preferable and $SnO_2$ is particularly preferable.

In case of using thermal transfer sheets in the laser thermal transfer recording method according to the present invention, it is preferable that the antistatic agent to be used in the back layers is substantially transparent so as to allow the permeation of laser beams.

In case of using an electrically conductive metal oxide as the antistatic agent, a smaller grain diameter is preferable to minimize light scattering. However, the grain diameter should be determined using the refraction index ratio between the grains and the binder as a parameter. It can be determined by using Mie's theory. In general, the average grain diameter ranges from 0.001 to 0.5 μm, preferably from 0.003 to 0.2 μm. The term average grain diameter as used herein means a value involving not only the primary grain diameter of the electrically conductive metal oxide but also grain diameters of higher structures thereof.

To prevent the adhesion of foreign materials such as dirt and dust to the thermal transfer sheet causing defects (white spots, etc.) in the image, it is preferable to control the surface electrical resistance SR of the back layer surface of the thermal transfer sheet to $10^{11}\Omega$ or below at 23° C. under 55% RH, still preferably $1\times10^{9}\Omega$ or less.

In addition to the antistatic agent, the first and second back layers may contain various additives such as a surfactant, a slipping agent and a matting agent or a binder. It is preferable that the first back layer contains from 10 to 1000 parts by mass, still preferably from 200 to 800 parts by mass, of the antistatic agent per 100 parts by mass of the binder. It is preferable that the second back layer contains from 0 to 300 parts by mass, still preferably from 0 to 100 parts by mass, of the anti static agent per 100 parts by mass of the binder.

Examples of the binder to be used in forming the first and second back layers include homopolymers and copolymers of acrylicmonomers such as acrylicacid, methacrylicacid, acrylic acid esters and methacrylic acid esters; cellulose-based polymers such as nitrocellulose, methylcellulose, ethylcellulose and cellulose acetate; vinyl polymers and vinyl compound copolymers such as polyethylene, polypropylene, polystyrene, vinyl chloride-based copolymers, vinyl chloride-vinyl acetate copolymer, polyvinylpyrrolidone, polyvinyl butylal and polyvinyl alcohol; condensed polymers such as polyester, polyurethane and polyamides; rubber-type thermoplastic polymers such as butadiene-styrene rubber; polymers obtained by polymerizing and crosslinking photopolymerizable or heat polymerizable compounds such as epoxy compounds; melamine compounds and the like.

(Photothermal Conversion Layer)

The photothermal conversion layer contains a photothermal conversion substance and a binder optionally together with a matting agent and, if needed, other components.

The photothermal conversion substance is a substance having a function of converting irradiated light energy into heat energy. In general, it is a colorant (including pigment, the same applies hereinafter) capable of absorbing laser beams. In case of recording an image with infrared laser, it is preferable to use an infrared-absorbing colorant as the photothermal conversion substance. Examples of the above-described colorant include black pigments such as carbon black, macrocyclic compounds showing absorption in visible to near-infrared regions such as phthalocyanine and naphthalocyanine, organicdyes (cyanine dyes such as indolenine dyes, anthraquinone dyes, azulene dyes, phthalocyanine dyes) employed as laser absorbers in high-density laser recording such as photodiscs, and organic metal compound colorants such as dithiol-nickel complex. Among all, it is preferable to use a cyanine dyes. This is because it shows a high coefficient of absorption to light in the infrared region and thus the photothermal conversion layer can be made into a thin layer with the use of the same as the photothermal conversion substance. As a result, the recording sensitivity of the thermal transfer sheet can be further elevated.

In addition to colorants, use can be made, as the photothermal conversion substance, granular metallic materials such as silver halide and inorganic materials.

As the binder to be added to the photothermal conversion layer, it is preferable to use a resin which has such a strength as at least allowing the formation of a layer on the substrate and has a high thermal transfer rate. It is still preferable to use a heat tolerant resin which is not decomposed even by the heat generated from the photothermal conversion substance in recording an image, since a favorable surface smoothness of the photothermal conversion layer can be maintained even after high-energy light irradiation. More specifically speaking, it is preferable to use a resin having a heat decomposition temperature (i.e., the temperature at which the mass is reduced by 5% in an air stream under elevating temperature at a speed of 10° C./min by the TGA (thermogravimetric analysis) method) of 400° C. or above, still preferably a resin having the above-described heat decomposition temperature of 500° C. or above. It is preferable to use a binder has a glass transition temperature of from 200 to 400° C., still preferably a binder having a glass transition temperature of from 250 to 350° C. In case where the glass transition temperature of the binder is lower than 200° C., the resultant image sometimes suffers from fogging. In case where the glass transition temperature is higher 400° C., the melting properties of the resin are worsened and thus the production efficiency is sometimes lowered.

It is preferable that the heat tolerance (for example, heat deformation temperature and heat decomposition temperature) of the binder in the photothermal conversion layer is superior to the materials employed in other layers formed on the photothermal conversion layer.

Specific examples thereof include acrylic acid-based resins such as polymethyl methacrylate, vinyl resins such as polycarbonate, polystyrene, vinyl chloride/vinyl acetate copolymer and polyvinyl alcohol, polyvinyl butylal, polyester, polyvinyl chloride, polyamide, polyimide, polyether imide, polysulfone, polyether sulfone, aramide, polyurethane, epoxy resin, urea/melamine resin, etc. Among all, polyimide resins are preferable.

In particular, it is preferable to use polyimide resins represented by the following general formulae (I) to (VII) which are soluble in organic solvents, since the thermal transfer sheet productivity can be elevated thereby. These resins also preferable from the viewpoint of improving the viscosity stability, long-time storage properties and moisture-proofness of a coating solution for photothermal conversion layer too.

(I)

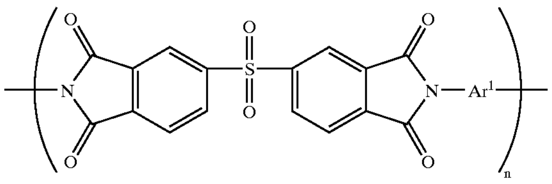

(II)

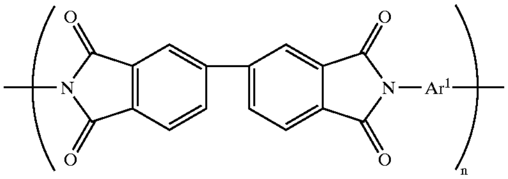

In the above general formulae (I) and (II), $Ar^1$ represents an aromatic group represented by any of the following structural formulae (1) to (3); and n is an integer of from 10 to 100.

(1)

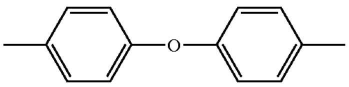

(2)

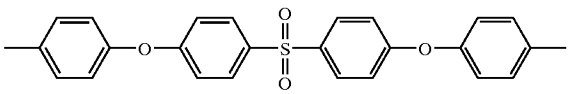

(3)

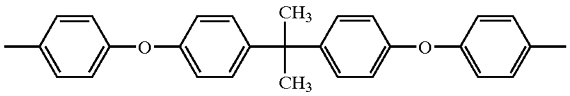

(III)

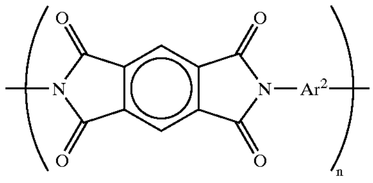

-continued (IV)

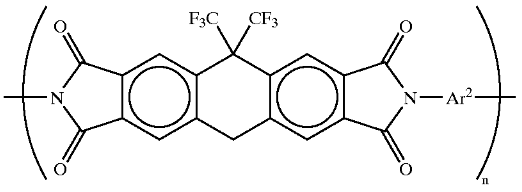

In the above general formulae (III) and (IV), $Ar^2$ represents an aromatic group represented by any of the following structural formulae (4) to (7); and n is an integer of from 10 to 100.

preferable to use a resin 100 parts by mass or more of which is soluble in 100 parts by mass of N-methylpyrrolidone.

As the matting agent to be added to the photothermal conversion layer, use is made of inorganic fine grains and organic fine grains. Examples of the inorganic fine grains include those made of silica, titanium oxide, aluminum oxide, zinc oxide, magnesium oxide, metal salts such as barium sulfate, magnesium sulfate, aluminum hydroxide, magnesium hydroxide and boron nitride, kaolin, clay, talc, zinc white, lead white, zeeklite, quartz, diatomaceous earth, barite, bentonite, mica, synthetic mica, etc. Examples of the organic fine grains include resin grains such as fluororesin grains, guanamine resin grains, styrene-acryl copolymer resin grains, silicone resin grains, melamine resin grains and epoxy resin grains.

(4)

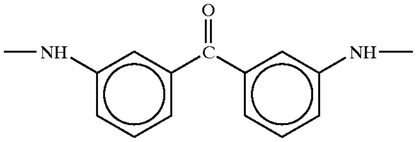

(5)

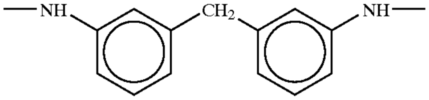

(6)

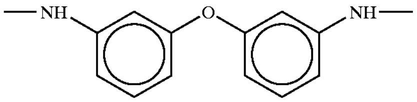

(7)

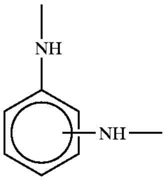

(V)

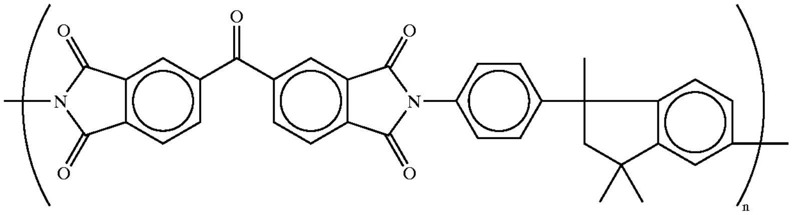

(VI)

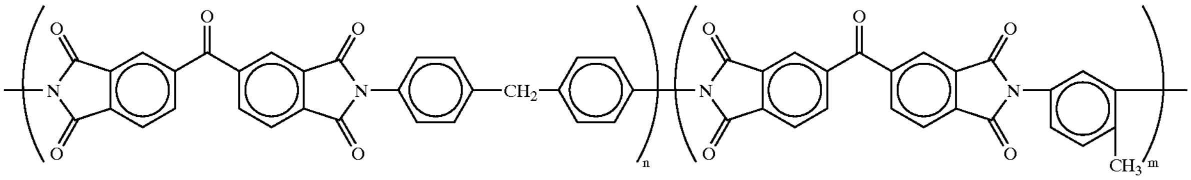

(VII)

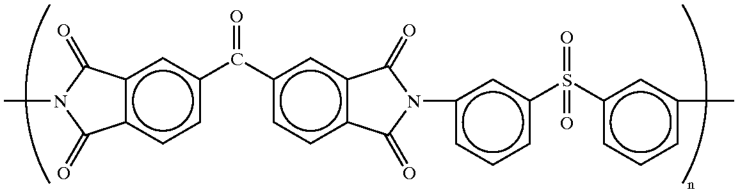

In the above general formulae (V) to (VII), n and m are each an integer of from 10 to 100. In the formula (VI), the ratio n:m is from 6:4 to 9:1.

To judge whether or not a resin is soluble in an organic solvent, the resin is dissolved in 100 parts by mass of N-methylpyrrolidone at 25° C. The dissolution of 10 parts by mass or more of the resin is employed as a standard. That is to say, a resin which is dissolved therein in an amount of 10 parts by mass or more is referred to as preferably usable as the resin for the photothermal conversion layer. It is still The grain diameter of the matting agent generally ranges from 0.3 to 30 μm, preferably from 0.5 to 20 μm and the addition level thereof preferably ranges from 0.1 to 100 $mg/m^2$.

If necessary, the photothermal conversion layer may further contain a surfactant, a thickener, an antistatic agent and so on.

The photothermal conversion layer can be formed by dissolving the photothermal conversion substance and the binder, adding, if necessary, the matting agent and other components thereto to give a coating solution, applying it on the substrate and then drying. Examples of the organic solvent in which the polyimide resin is to be dissolved include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol, methanol and so on. Application and drying can be carried out with the use of application and drying procedures commonly employed. Drying is usually performed at a temperature of 300° C. or below, preferably 200° C. or below. In case of using polyethylene terephthalate as the substrate, it is preferable to dry at a temperature of 80 to 150° C.

In case where the photothermal conversion layer contains an excessively small amount of the binder, the cohesive force of the photothermal conversion layer is lowered. As a result, the photothermal conversion layer is frequently transferred together with the formed image onto the image receptor sheet, thereby causing color mixing in the printed image. In case where the binder is employed too much, the thickness of the photothermal conversion layer should be enlarged to achieve a certain light absorptivity, thereby causing a decrease in sensitivity in many cases. The mass ratio (on the solid basis) of the photothermal conversion substance to the binder in the photothermal conversion layer preferably ranges from 1:20 to 2:1, still preferably from 1:10 to 2:1.

It is also preferable to make the photothermal conversion layer into a thin film, since the sensitivity of the thermal transfer sheet can be thus elevated as described above. The thickness of the photothermal conversion layer preferably ranges from 0.03 to 1.0 μm, still preferably from 0.05 to 0.5 μm. It is also preferable that the photothermal conversion layer has an optical density of 0.80 to 1.26 to light of 808 nm in wavelength, since the transfer sensitivity of the image formation layer can be improved in this case. It is still preferable that the optical density to light of the above-described wavelength is from 0.92 to 15. In case where the optical density at the laser peak wavelength is less than 0.80, the irradiated light cannot be sufficiently converted into heat and, as a result, the transfer sensitivity is sometimes lowered. In case where the optical density exceeds 1.26, on the other hand, the function of the photothermal conversion layer in recording is affected and thus fogging arises in some cases.

(Image Formation Layer)

The image formation layer contains at least a pigment to be transferred onto the image receptor sheet to form an image. If necessary, it may further contain a binder for forming the layer and other components.

In general, pigments are roughly classified into organic pigments and inorganic pigments. The formers are excellent particularly in the transparency of coating films, while the latters are excellent in shielding effect, etc. Thus, an appropriate one may be selected depending on the purpose. In case of using the above-described thermal transfer sheets in print color proofing, it is adequate to use organic pigments having the same or similar color tones as yellow, magenta, cyan and black which are generally employed in printing inks. Moreover, use is sometimes made of metal powders, fluorescent pigments, etc. Examples of pigments appropriately employed include azo pigments, phthalocyanine pigments, anthraquinone pigments, dioxazine pigments, quinacridone pigments, isoindolinone pigments and nitro pigments. Next, pigments usable in the image formation layers will be listed, though the present invention is not restricted thereto.

1) Yellow pigment

Pigment Yellow 12 (C.I. No. 21090)

Example) Permanent Yellow DHG (manufactured by Clariant Japan), Lionol Yellow 1212B (manufactured by Toyo Ink), Irgalite Yellow LCT (manufactured by Ciba Speciality Chemicals), Symuler Fast Yellow GTF (manufactured by Dainippon Ink & Chemicals), Pigment Yellow 13 (C.I. No. 21100)

Example) Permanent Yellow GR (manufactured by Clariant Japan), Lionol Yellow 1313 (manufactured by Toyo Ink)

Pigment Yellow 14 (C.I. NO. 21095)

Example) Permanent Yellow G (manufactured by Ciba Speciality Chemicals), Lionol Yellow 1401-G (manufactured by Toyo Ink), Seika Fast Yellow2270 (manufactured by Dainichiseika Color & Chemical), Symuler Fast Yellow 4400 (manufactured by Dainippon Ink & Chemicals)

Pigment Yellow 17 (C.I. No. 21105)

Example) Permanent Yellow GG02 (manufactured by Clariant Japan), Symular Fast Yellow 8GF (manufactured by Dainippon Ink & Chemicals)

Pigment Yellow 155

Example) Graphtol Yellow 3GP (manufactured by Clariant Japan)

Pigment Yellow 180 (C.I. No. 21290)

Example) Novoperm Yellow P-HG (manufactured by Clariant Japan), PV Fast Yellow HG (manufactured by Clariant Japan)

Pigment Yellow 139 (C.I. No. 56298)

Example) Novoperm Yellow M2R 70 (manufactured by Clariant Japan)

2) Magenta pigment

Pigment Red 57:1 (C.I. No. 15850:1)

Example) Graphtol Rubine L6B (manufactured by Clariant Japan), Lionol Red6B-4290G (manufactured by Toyo Ink), Irgalite Rubine4BL (manufactured by Ciba Speciality Chemicals), Symuler Brilliant Carmine 6B-229 (manufactured by Dainippon Ink & Chemicals), Pigment Red 122 (C.I. No. 73915)

Example) Hosterperm Pink E (manufactured by Clariant Japan), Lionogen Magenta 5790 (manufactured by Toyo Ink), Fastogen Super Magenta RH (manufactured by Dainippon Ink & Chemicals)

Pigment Red 53:1 (C.I. No. 15585:1)

Example) Permanent Lake Red LCY (manufactured by Clariant Japan), Symuler Lake Red C conc (manufactured by Dainippon Ink & Chemicals)

Pigment Red 48:1 (C.I. No. 15865:1)

Example) Lionol Red 2B 3300 (manufactured by Toyo Ink), Symuler Red NRY (manufactured by Dainippon Ink & Chemicals)

Pigment Red 48:2 (C.I. No. 15865:2)

Example) Permanent Red W2T (manufactured by Clariant Japan), Lionol Red LX235 (manufactured by Toyo Ink), Symuler Red 3012 (manufactured by Dainippon Ink & Chemicals)

Pigment Red 48:3 (C.I. No. 15865:3)

Example) Permanent Red 3RL (manufactured by Clariant Japan), Symuler Red 2BS (manufactured by Dainippon Ink & Chemicals)

Pigment Red 177 (C.I. NO. 65300)

Example) Cromophtal Red A2B (manufactured by Ciba Speciality Chemicals)

3) Cyan pigment

Pigment Blue 15 (C.I. No. 74160)

Example) Lionol Blue 7027 (manufactured by Toyo Ink), Fastogen Blue BB (manufactured by Dainippon Ink & Chemicals)

Pigment Blue 15:1 (C.I. No. 74160)

Example) Hosterperm Blue A2R (manufactured by Clariant Japan), Fastogen Blue 5050 (manufactured by Dainippon Ink & Chemicals)

Pigment Blue 15:2 (C.I. No. 74160)

Example) Hosterperm Blue AFL (manufactured by Clariant Japan), Irgalite Blue BSP (manufactured by Ciba Speciality Chemicals), Fastogen Blue GP (manufactured by Dainippon Ink & Chemicals)

Pigment Blue 15:3 (C.I. No. 74160)

Example) Hosterperm Blue B2G (manufactured by Clariant Japan), Lionol Blue FG7330 (manufactured by Toyo Ink), Cromophthal Blue 4GNP (manufactured by Ciba Speciality Chemicals), Fastogen Blue FGF (manufactured by Dainippon Ink & Chemicals)

Pigment Blue 15:4 (C.I. No. 74160)

Example) Hosterperm Blue BFL (manufactured by Clariant Japan), Cyanine Blue 700-1OFG (manufactured by Toyo Ink), Irgalite Blue GLNF (manufactured by Ciba Speciality Chemicals), Fastogen Blue FGS (manufactured by Dainippon Ink & Chemicals)

Pigment Blue 15:6 (C.I. No. 74160)

Example) Lionol Blue ES (manufactured by Toyo Ink)

Pigment Blue 60 (C.I. No. 69800)

Example) Hosterperm Blue RL01 (manufactured by Clariant Japan), Lionogen Blue 6501 (manufactured by Toyo Ink)

4) Black pigment

Pigment Black 7 (carbon black C.I. No. 77266)

Example) Mitsubishi Carbon Black MA100 (manufactured by Mitsubishi Chemical), Mitsubishi Carbon Black #5 (manufactured by Mitsubishi Chemical), Black Pearls 430 (manufactured by Cabot Co.).

As the pigments usable in the present invention, appropriate products can be selected by reference to "Ganryo Binran, ed. by Nihon Ganryo Kijutsu Kyokai, Seibundo Shinkosha, 1989", "COLOUR INDEX, THE SOCIETY OF DYES & COLOURIST, THIRD EDITION, 1987", etc.

The average grain diameter of the above-described pigments preferably ranges from 0.03 to 1 $\mu$m, still preferably from 0.05 to 0.5 $\mu$m.

When the above-described grain diameter is less than 0.3 $\mu$m, the dispersion cost is elevated or the dispersion sets to gel in some cases. When the grain diameter exceeds 1 $\mu$m, on the other hand, coarse grains in the grain sometimes worsens the adhesiveness between the image formation layer and the image receptor layer. In this case, moreover, the transparency of the image formation layer is sometimes damaged.

As the binder to be used in the image formation layer, it is preferable to use an amorphous organic polymer having a softening point of from 40 to 150° C. As the above-described amorphous organic polymer, use can be made of butylal resin, polyamide resin, polyethylene imine resin, sulfonamide resin, polyester polyol resin, petroleum resin, homopolymers and copolymers of sytrene and its derivatives which may be substituted such as vinyl toluene, $\alpha$-methylstyrene, 2-methylstyrene, chlorostyrene, vinylbenzoic acid, sodium vinylbenzenesulfonate and aminostyrene, homopolymers and copolymers with other monomers of methacrylic acid esters such as methyl methacrylate, ethyl methacrylate, butyl methacrylate and hydroxyethyl methacrylate and methacrylic acid, acrylic acid esters such as methyl acrylate, ethyl acrylate, butyl acrylate and $\alpha$-ethylhexyl acrylate and acrylic acid, dienes such as butadiene and isoprene, acrylonitrile, vinyl ethers, maleic acid and maleic acid esters, maleic anhydride, cinnamic acid and vinyl monomers such as vinyl chloride and vinyl acetate. Either one of these resins or a mixture of two or more thereof may be used.

It is preferable that the image formation layer contains from 30 to 70% by mass of the pigment, still preferably from 30 to 50% bypass. It is also preferable that the image formation layer contains from 30 to 70% by mass of the resin, still preferably from 40 to 70% by mass.

As the additional components as described above, the image formation layer may contain the following components (1) to (3).

(1) Wax

As the wax, mineral waxes, natural waxes, synthetic waxes, etc. may be cited. Examples of the above-described mineral waxes include petroleum waxes such as paraffin wax, microcrystalline wax, ester wax and oxidized wax, montan wax, ozokerite wax, ceresine, etc. Among all, paraffin wax separated from petroleum is preferable. There are marketed various types of paraffin wax having different melting points.

Examples of the above-described natural waxes include vegetable waxes such as carnauba wax, candelilla wax, ouricury wax and esper wax, and animal waxes such as bees wax, insect wax, shellac and whale wax.

The above-described synthetic waxes, which are generally employed as lubricants usually consist of higher fatty acid compounds. Examples of these synthetic waxes are as follows.

1) Fatty Acid Wax

Linear saturated fatty acids represented by the following general formula:

$$CH_3(CH_2)_nNCOOH.$$

In the above formula, n is an integer of from 6 to 28. Specific examples thereof include stearic acid, behenic acid, palmitic acid, 12-hydroxystearic acid, azelaic acid, etc.

Moreover, metal (K, Ca, Zn, Mg, etc.) salts of the above-described fatty acids may be cited.

2) Fatty Acid Ester Wax

Specific examples of the above-described fatty acid esters include ethyl stearate, lauryl stearate, ethyl behenate, hexyl behenate, behenyl myristate, etc.

3) Fatty Acid Amide Wax

Specific examples of the above-described fatty acid amides include stearic acid amide, lauric acid amide, etc.

4) Aliphatic Alcohol Wax

Linear saturated aliphatic alcohols represented by the following general formula:

$$CH_3(CH_2)_nOH.$$

In the above formula, n is an integer of from 6 to 28. Specific examples thereof include stearyl alcohol, etc.

Among the synthetic waxes 1) to 4) as listed above, higher fatty acid amides such as stearic acid amide and lauric acid amide are particularly appropriate. One of these wax compounds may be used alone. Alternatively, an adequate combination thereof may be used if needed.

(2) Plasticizer

As the above-described plasticizer, an ester compound is preferable. Examples thereof include publicly known plasticizers such as aliphatic dibasic acid esters, for example, phthalates such as dibutyl phthalate, di-n-octyl phthalate, di(2-ethylhexyl)phthalate, dinonyl phthalate, dilauryl phthalate, butyl lauryl phthalate and butyl benzyl phthalate, di(2-ethylhexyl)adipate and di(2-eethylhexyl)sebacate, phosphoric acid triesters such as tricresyl phosphate and tri(2-ehtylhexyl)phosphate, polyol polyesters such as polyethylene glycol ester, and epoxy compounds such as epoxy fatty acid esters. Among these plasticizers, vinyl monomer esters, in particular, acrylic acid or methacrylic acid esters are preferable, since they are highly effective in improving the transfer sensitivity, relieving uneven transfer and controlling the break elongation.

Examples of the above-described acrylic acid or methacrylic acid ester compounds include polyethylene glycol dimethacrylate, 1,2,4-butanetriol trimethacrylate, trimethylolethane triacrylate, pentaerythritol acrylate, pentaerythritol tetraacrylate, dipentaerythritol polyacrylate, etc.

The above-described plasticizer may be a polymer. Among all, polyesters are preferable from the viewpoints of having remarkable addition effects and hardly diffusing under the storage conditions. As the polyester, use may be made of, for example, sebacate polyesters and adipate polyesters.

The additives to be added to the image formation layer are not restricted to the above-described ones. Either a single plasticizer or two or more thereof may be used.

In case where the image formation layer contains the above-described additives in an excessively large amount, there sometimes arise problems such as worsening in the resolution of the transferred image, lowering in the film strength of the image formation layer per se, or transfer of the unexposed parts onto the image receptor sheet due to a decrease in the adhesiveness between the photothermal conversion layer and the image formation layer. From these points of view, the content of the above-described wax preferably ranges from 0.1 to 30% by mass, still preferably from 1 to 20% by mass, based on the total solid content in the image formation layer. The content of the above-described plasticizer preferably ranges from 0.1 to 20% by mass, still preferably from 1 to 10% by mass, based on the total solid content in the image formation layer.

(3) Others

In addition to the above-described components, the image formation layer may contain a surfactant, inorganic or organic fine grains (metallic powder, silica gel, etc.), oils (castor oil, mineral oil, etc.), a thickener, an antistatic agent and so on. Excluding case of obtaining a black image, energy required for the transfer can be lessened by using a substance which absorbs the wavelength of a light source to be used in the image recording. The substance absorbing the light source wavelength may be either a pigment or a dye. In case of obtaining a color image, it is preferable in reproducing colors to use a dye which has little absorption in the visible region and largely absorbs the light source wavelength. As examples of near-red dyes, compounds described in JPA3-103476 may be cited.

The image formation layer can be formed by preparing a coating solution in which a pigment, the above-described binder, etc. are dissolved or dispersed, applying it on the photothermal conversion layer (or on the heat-sensitive removal layer as will be described hereinafter, if provided on the photothermal conversion layer) and drying. Examples of the solvent to be used in the preparation of the coating solution include n-propyl alcohol, methyl ethyl ketone, propylene glycol monomethyl ether (MFG), methanol, water, etc. Application and drying can be carried out with the use of application and drying procedures commonly employed.

On the photothermal conversion layer of the above-described thermal transfer sheet, a heat-sensitive removal layer can be formed. The heat-sensitive removal layer contains a heat-sensitive material which evolves a gas or liberates adhering water, etc. under the effect of heat generated from the photothermal conversion layer to thereby weaken the adhesion strength between the photothermal conversion layer and the image formation layer. As the heat-sensitive material, use may be made of a compound (a polymer or a low-molecular weight compound) which is decomposed or degenerated per se by heat to evolve a gas, a compound (a polymer or a low-molecular weight compound) having a considerably large amount of a highly vaporizable liquid (for example, water) absorbed or adsorbed thereby and the like. It is also possible to use these compounds together.

Examples of the polymer which is decomposed or degenerated per se by heat to evolve a gas include autooxidizable polymers such as nitrocellulose, halogenated polymers such as polyolefin chloride, chlorinated rubber, polychlorinated rubber, polyvinyl chloride and polyvinylidene chloride, acrylic polymers having a volatile compound (water, etc.) adsorbed thereby such as polyisobutyl methacrylate, cellulose esters having a volatile compound (water, etc.) adsorbed thereby such as ethyl cellulose, natural high-molecular weight compound having a volatile compound (water, etc.) adsorbed thereby such as such as gelatin and the like. Examples of the low-molecular weight compound which is decomposed or degenerated per se by heat to evolve a gas include compounds which are decomposed under heating to evolve a gas such as diazo compounds and azide compounds.

It is preferable that the decomposition, degeneration, etc. of the heat-sensitive material due to heat arise at 280° C. or lower, in particular, at 230° C. or lower.

In case of using a low-molecular weight compound as the heat-sensitive material in the heat-sensitive removal layer, it is desirable to combine the compound with a binder. As the binder, use may be made of the polymer which is decomposed or degenerated per se by heat to evolve a gas as described above. Alternatively, use may be made of a commonly employed binder having no such properties. In case of using a heat-sensitive low-molecular weight compound together with a binder, the mass ratio of the former to the latter preferably ranges from 0.02:1 to 3:1, still preferably from 0.05:1 to 2: 1. It is desirable that the heat-sensitive removal layer almost entirely covers the photothermal conversion layer. The thickness of the heat-sensitive removal layer generally ranges from 0.03 to 1 $\mu$m, preferably from 0.05 to 0.5 $\mu$m.

In case of a thermal transfer sheet made up of a photothermal conversion layer, a heat-sensitive removal layer and an image formation layer laminated in this order on a substrate, the heat-sensitive removal layer is decomposed or degenerated due to the heat from the photothermal conversion layer and thus evolves a gas. Due to the decomposition or the gas evolution, the heat-sensitive removal layer is partly lost or cohesive failure occurs within the heat-sensitive removal layer. As a result, the binding force between the photothermal conversion layer and the image formation layer is lowered. Accordingly, it is sometimes observed, depending on the behavior of the heat-sensitive removal layer, that the heat-sensitive removal layer partly adheres to the image formation layer and appears on the surface of the finally formed image, thereby causing color mixing in the image. Therefore, it is desirable that the heat-sensitive removal layer is little colored (i.e., showing a high permeability to visible rays) so that the formed image suffers from no visual color mixing even though the heat-sensitive removal layer is transferred. More specifically speaking, the visible ray absorptivity of the heat-sensitive removal layer is 50% or below, preferably 10% or below.

In an alternative constitution, the thermal transfer sheet has no independent heat-sensitive removal layer but a photothermal conversion layer which is formed by adding the above-described heat-sensitive material to the photothermal conversion layer coating solution. Namely, the photothermal conversion layer also serves as the heat-sensitive removal layer in this case.

The coefficient of static friction of the back layer surface of the thermal transfer sheet is controlled to 0.7 or below, preferably 0.4 or below. The coefficient of static friction of the image formation layer surface is controlled to 0.5 or below, preferably 0.2 or below. By controlling the coefficients of static friction of the back layer surface and the image formation layer surface respectively to the above-described levels, stains on a roll transporting the thermal transfer sheet can be prevented and the transportation can be carried out in a stable state without causing positioning errors or jamming. Moreover, a high-quality image can be obtained thereby. The coefficient of static friction is measured by the following method.

A thermal transfer sheet sample (5 cm×20 cm) is bonded onto a table. Using a pressure-sensitive adhesive tape (for example, a polyester pressure-sensitive adhesive tape No. 31B75 High, manufactured by Nitto Denko), the substrate of the thermal transfer sheet is adhered to the table (i.e., the image formation layer being upward). A stainless terminal (35 mm×75 mm, curved face of 2.5 mmr, 200 g) having smooth surface is placed on the image formation layer and then the table is slowly inclined. The tilt angle θ is measured at the point that the above-described stainless terminal begins to slip. The coefficient of static friction is expressed in tan θ.

It is preferable that the smooster value of the image formation layer surface is from 0.5 to 50 mmHg (≈0.0665 to 6.65 kPa) at23° C. UNDER 55%RH. Thus, a large number of microvoids, in which the image formation layer cannot be in contact with the image formation layer, can be lessened, thereby resulting in merits in transfer and image qualities. It is also preferable that the surface hardness of the image formation layer is 10 g or above when measured with a sapphire stylus. When the thermal transfer sheet is electrically charged in accordance American Standard Test Method 4046, it is preferable that the electrical potential 1 second after grounding the thermal transfer sheet is from −100 to 100 V. It is preferable that the surface electrical resistance SR of the image formation layer is $10^{11}\Omega$ or below at 23° C. UNDER 55% RH, still preferably $10^{9}\Omega$ or below.

The surface roughness Rz of the image formation layer surface is preferably 3 μm or below, still preferably 1.5 μm or below. The surface roughness Rz of the back layer surface is preferably 7 μm or below, still preferably 1 μm or below. Thus, the transport properties of the thermal transfer sheet can be stabilized and the transfer properties of the image formation layer to the image receptor layer can be improved. As a result, a transfer image with excellent qualities can be obtained.

Next, the image receptor sheet to be used in combination with the above-described thermal transfer sheets will be described.

[Image Receptor Sheet]

(Constitution of Layers)

In usual, the image receptor sheet has a substrate and one or more image receptor layers formed thereon. If needed, one or more layers selected from a cushion layer, a removal layer and an intermediate layer are provided between the substrate and the image receptor layer. Moreover, it has a back layer on the face of the substrate in the opposite side to the image receptor layer, which is favorable from the viewpoint of transport properties.

(Substrate)

As the substrate, citation may be made of commonly employed sheet-type base materials such as plastic sheets, metal sheets, glass sheets, resin-coated paper, paper and various composite materials. Examples of the plastic sheets include polyethylene terephthalate sheets, polycarbonate sheets, polyethylene sheets, polyvinyl chloride sheets, polyvinylidene chloride sheets, polystyrene sheets, styrene-acrylonitrile sheets, polyester sheets and so on. As the paper, use may be made of printing paper, coated paper and so on.

It is preferable that the substrate has micropores (voids), since the image qualities can be improved thereby. Such a substrate can be produced by, for example, mixing a thermoplastic resin with a filler comprising an inorganic pigment or a polymer incompatible with the above-described thermoplastic resin, etc. to give a molten mixture, treating the mixture with a melt extruder to give a single-layered or multilayered film and then orienting either monoaxially or biaxially. In this case, the porosity is determined depending on the selected resin and filler, the mixing ratio, the orientation conditions, etc.

As the above-described thermoplastic resin, it is preferable to use a polyolefin resin such as polypropylene or a polyethylene terephthalate resin which are excellent in crystallinity and orientation properties and facilitate the formation of voids. It is preferable to use the above-described polyolefin resin or polyethylene terephthalate resin as the main component optionally together with a small amount of other thermoplastic resin(s). It is preferable that the inorganic pigment to be used as the above-described filler has an average grain size of from 1 to 20 μm. Use may be made therefor of calcium carbonate, clay, diatomaceous earth, titanium oxide, aluminum hydroxide, silica, etc. In case of using polypropylene as the thermoplastic resin, it is preferable to use polyethylene terephthalate as the incompatible resin employed as a filler. A substrate having micropores (voids) is described in detail in JPA 2001-105752.

The content of the filler such as the inorganic pigment in the substrate generally ranges from about 2 to 30% by volume.

The thickness of the image receptor sheet usually ranges from 10 to 400 μm, preferably from 25 to 200 μm. To improve the adhesiveness to the image receptor layer (or the cushion layer) or to improve the adhesiveness to the image formation layer of the thermal transfer sheet, the surface of the substrate may be surface-treated by, for example, corona discharge or glow discharge.

(Image Receptor Layer)

On the surface of the image receptor sheet, it is preferable that one or more image receptor layers are formed on the substrate in order to transfer the image formation layer and fix the same. It is preferable that the image receptor layer is a layer mainly comprising an organic polymer binder. As the above-described binder, a thermoplastic resin is preferably employed. Examples thereof include homopolymers and copolymers of acrylic monomers such as acrylic acid, methacrylic acid, acrylic acid esters and methacrylic acid esters; cellulose-based polymers such as methylcellulose, ethylcellulose and cellulose acetate; homopolymers and copolymers of vinyl monomers such as polystyrene, polyvinylpyrrolidone, polyvinyl alcohol and polyvinyl chloride; condensed polymers such as polyester and polyamides; and rubber-type polymers such as butadiene-styrene rubber. To achieve an appropriate adhesive force to the image formation layer, it is preferable that the binder in the image receptor layer is a polymer having a glass transition temperature (Tg) of 90° C. or lower. It is therefore possible to add a plasticizer to the image receptor layer. To prevent blocking between sheets, it is preferable to use a binder polymer having a Tg of 30° C. or higher. From the viewpoints of improving the adhesiveness to the image formation layer during laser recording and enhancing the sensitivity and image strength, it is particularly preferable that the binder polymer in the image receptor layer is the same or similar to the binder polymer in the image formation layer.

It is preferable that the smooster value of the image formation layer surface is from 0.5 to 50 mmHg (≈0.0665 to 6.65 kPa) at 23° C. UNDER 55%RH. Thus, a large number of microvoids, in which the image formation layer cannot be in contact with the image formation layer, can be lessened, thereby resulting in merits in transfer and image qualities.

When the image receptor sheet is electrically charged in accordance American Standard Test Method 4046, it is preferable that the electrical potential 1 second after grounding the image receptor layer is from −100 to 100 V. It is preferable that the surface electrical resistance SR of the image receptor layer is $10^{14}\Omega$ or below at 23° C. UNDER 55% RH, still preferably $10^{9}\Omega$ or below. Thus, the adhesion of foreign materials and dusts to the image receptor layer surface, which causes defects in the image, can be avoided.

To prevent positioning errors or jamming during the transport of the image receptor sheet, it is preferable that the coefficient of static friction of the image receptor layer surface is 0.5 or below, still preferably 0.2 or below. It is also preferable that the surface roughness Rz of the image receptor layer surface is from 1 to 5 μm, still preferably from 2 to 4 μm.

The surface energy of the image receptor layer surface preferably ranges from 23 to 35 $mg/mm^2$.

In case where an image is once formed on the image receptor layer and then transferred again onto printing paper or the like, it is preferable that at least one of the image receptor layers is made of a photosetting material. Such a photosetting material is composed of, for example, a combination of: a) a photopolymerizable monomer comprising at least one member selected from among polyfunctional vinyl and vinylidene compounds capable of forming a photopolymer by addition polymerization; b) an organic polymer; and c) a photopolymerization initiator optionally together with other additives such as a heat polymerization inhibitor. As the above-described polyfunctional vinyl monomer, use may be made of unsaturated esters of polyol, in particular, acrylic acid or methacrylic acid esters (for example, ethylene glycol diacrylate, pentaerythritol tetraacrylate).

Examples of the above-described polymer include the polymers cited above for forming the image receptor layer. As the photopolymerization initiator, use can be made of a commonly employed photoradical initiator such as benzophenone or Michler's ketone in an amount of 0.1 to 20% by mass in the layer.

The thickness of the image receptor layer ranges from 0.3 to 7 μm, preferably from 0.7 to 4 μm. In case where the thickness is less than 0.3 μm, the layer is liable to tear upon retransfer to printing paper due to insufficient film strength. In case where the layer is too thick, on the other hand, the gloss of the image is elevated after the retransfer onto the paper and thus the approximation to the printed matter is worsened.

(Other Layers)

A cushion layer may be provided between the substrate and the image receptor layer. By forming the cushion layer, the adhesiveness between the image formation layer and the image receptor layer can be improved in the step of laser thermal transfer and thus the image qualities can be improved. When foreign materials invade between the thermal transfer sheet and the image receptor sheet during recording, the space between the thermal transfer sheet and the image formation layer is lessened owing to the deformation of the cushion layer. As a result, pattern defect sizes (white spots, etc.) can be lessened. In case where an image transferred is further transferred on printing paper or the like prepared separately, the image surface can be deformed corresponding to the uneven surface of the paper. Thus, the transfer properties of the image receptor layer can be improved. Moreover, the approximation to the printed matter can be improved by lowering the gloss of the subject to be transferred.

The cushion layer has a constitution easily allowing deformation upon the application of a force. To achieve the above-described effects, it is preferable that the cushion layer is made of a material having a low modulus of elasticity, a material having a rubber elasticity or a thermoplastic resin which is easily softened by heating. The modulus of elasticity of the cushion layer at room temperature preferably ranges from 0.5 MPa to 1.0 GPa, still preferably from 1 MPa to 0.5 GPa and particularly preferably from 10 to 100 MPa. In order to embed foreign materials such as dusts, it is preferable that the cushion layer has a penetration degree as specified by JIS K2530 of 10 or more (25° C., 100 g, 5 sec). The glass transition temperature of the cushion layer is 80° C. or lower, preferably 25° C. or lower, while its softening point is preferably from 50 to 200° C. To appropriately control these physical properties (for example, Tg), a plasticizer may be added to the binder.

Specific examples of the material to be used as a binder in the cushion layer include rubbers such as urethane rubber, butadiene rubber, nitrile rubber, acryl rubber and natural rubber, and polyethylene, polypropylene, polyester, styrene-butadiene copolymer, ethylene-vinyl acetate copolymer, ethylene-acryl copolymer, vinyl chloride-vinyl acetate copolymer, vinylidene chloride resin, vinyl chloride resin containing a plasticizer, polyamide resin and phenol resin and so on.

Although the thickness of the cushion layer varies depending on the resin employed and other factors, it usually ranges from 3 to 100 μm, preferably from 10 to 52 μm.

Although the image receptor layer and the cushion layer should be bonded to each other until the step of laser recording, it is preferable that these layers are in a removable state for transferring the image onto printing paper. To facilitate the removal, it is preferable to provide a removal layer of 0.1 to 2 μm in thickness between the cushion layer and the image receptor layer. Since a removal layer having an excessively large thickness also serves as a cushion layer, it is necessary to control the thickness depending on the type of the removal layer.

Specific examples of the binder in the removal layer include polyolefin, polyester, polyvinyl acetal, polyvinyl formal, polyparabanic acid, polymethyl methacrylate, polycarbonate, ethylcellulose, nitrocellulose, methylcellulose, carboxymethylcellulose, hydroxypropylcellulose, polyvinyl alcohol, polyvinyl chloride, urethane resin, fluororesin, styrenes such as polystyrene and acrylonitrile styrene, crosslinked products of these resins, thermosetting resins having Tg of 65° C. or higher such as polyamide, polyimide, polyether imide, polysulfone, polyether sulfone and aramide and set products of these resins. As a setting agent, use can be made of a commonly employed setting agent such as isocyanate or melamine.

To select the binder in the removal layer taking the above-described physical properties into consideration, polycarbonate, acetal and ethylcellulose are preferable from the viewpoint of storage properties. It is still preferable to use an acrylic resin in the image receptor layer, since the removability is improved in the step of retransferring an image after the laser thermal transfer.

It is also possible to employ a layer which shows a considerable decrease in the adhesiveness to the image receptor layer upon cooling as the removal layer. More specifically speaking, a layer containing, as the main component, a hot melt compound such as a wax or a binder or a thermoplastic resin can be formed.

As examples of the hot melt compound, substances reported in JPA 63-193886 may be cited. It is particularly preferable to use microcrystalline wax, paraffin wax, carnauba wax, etc. As the thermoplastic resin, it is preferable to use an ethylene-based copolymer such as ethylene-vinyl acetate resin or cellulose-based resin.

If necessary, the removal layer may further contain additives such as a higher fatty acid, a higher alcohol; a higher fatty acid ester, an amide, a higher amine and so on.

Another constitution of the removal layer is a layer which is molten or softened upon heating and thus undergoes cohesive failure per se to thereby exhibit removability. It is preferable that such a removal layer contains a supercoolant.

Examples of the supercoolant include poly-ε-caprolactone, polyoxyethylene, benzotriazole, tribenzylamine, vaniline, etc.

In another constitution of the removal layer, it contains a compound lowering the adhesiveness to the image receptor layer. Examples of such a compound include silicone-based resins such as silicone oil; fluororesins such as teflon and fluorinated acrylic resins; polysiloxane resins; acetal resins such as polyvinyl butylal, polyvinyl acetal and polyvinyl formal; solid waxes such as polyethylene wax and amide wax; fluorine-based or phosphate-based surfactants, and so on.

To form the removal layer, use can be made of the coating method wherein the above-described materials are dissolved in a solvent or dispersed to give a latex and then coated with the use of a blade coater, a roll coater, a bar coater, a curtain coater, a gravure coater, etc., the extrusion lamination method and the like. Thus, the removal layer can be applied and formed on the cushion layer. Alternatively, it is possible that a solution of the above-described materials in a solvent or a dispersion thereof in the state of a latex is applied on a transient base by a method cited above and, after bonding to the cushion layer, the transient base is stripped to thereby form the removal layer.

In the image receptor sheet to be combined with the above-described thermal transfer sheets, the image receptor layer may serve as the cushion layer too. In this case, the image receptor sheet may composed of the substrate/the cushiony image receptor layer, or the substrate/an undercoat layer/the cushiony image receptor layer. In this case, it is also preferable that the cushiony image receptor layer is provided in a removable manner to ensure retransfer onto printing paper. Thus, the image retransferred onto the printing paper is excellent in gloss.

The thickness of the cushiony image receptor layer ranges from 5 to 100 μm, preferably 10 to 40 μm.

To achieve favorable transport properties, the image receptor sheet is further provided with a back layer on the face opposite to the face having the image receptor layer. It is preferable that the above-described back layer contains an antistatic agent such as a surfactant or fine tin oxide grains, and a matting agent such as silicon oxide or PMMA grains to as to improve the transport properties in the recorder.

The additives as cited above may be added not only to the back layer but also to the image receptor layer and other layers, if needed. Types of these additives cannot be specified in general but vary depending on the purpose. In case of a matting agent, for example, grains having an average particle diameter of 0.5 to 10 μm can be added to a layer in an amount of about 0.5 to 80%. An antistatic agent may be appropriately selected from various surfactants and electrical conductive agents so that the surface electrical resistance of a layer is controlled to $10^{12}\Omega$ or below, preferably $10^{9}\Omega$ or below when measured at 23° C. under 55% RH.

As the binder to be used in the back layer, use can be made of commonly employed polymers such as gelatin, polyvinyl alcohol, methylcellulose, nitrocellulose, acetylcellulose, aromatic polyamide resin, silicone resin, epoxy resin, alkyd resin, phenol resin, melamine resin, fluororesin, polyimide resin, urethane resin, acrylic resin, urethane-modified silicone resin, polyethylene resin, polypropylene resin, polyester resin, teflon resin, polyvinyl butylal resin, vinyl chloride-based resin, polyvinyl acetate, polycarbonate, organic boron compounds, aromatic esters, fluorinated polyurethane and polyether sulfone.

When a crosslinkable and water-soluble binder is employed as the binder in the back layer and crosslinked, the fall-out of the matting agent can be prevented and the scratch-resistance of the back layer can be improved. Moreover, it is highly effective on blocking during storage.

As the means of crosslinking, one or more factors selected from among heat, active rays and pressure can be selected depending on the characteristics of the crosslinking agent employed without particular restriction. It some cases, it is also possible to provide an arbitrary pressure-sensitive adhesive layer in the side of the substrate of forming the back layer so as to impart pressure-sensitive adhesiveness to the substrate.

As the matting agent preferably added to the back layer, use can be made of organic or inorganic fine grains. Examples of the organic matting agent include fine particles of radical polymerized polymers such as polymethyl methacrylate (PMMA), polystyrene, polyethylene, polypropylene and the like, and fine particles of fusion polymers such as polyester and polycarbonate.

It is preferable that the back layer is formed at an coating dose of about 0.5 to 5 $g/m^2$. In case where the coating dose is less than 0.5 $g/m^2$, there frequently arise problems such as fall-off of the matting agent because of unstable coating properties. When it is applied in a dose largely exceeding 5 $g/m^2$, on the other hand, the appropriate grain diameter of the matting agent becomes extremely large and thus embossing of the image receptor layer due to the back layer occurs during storage. As a result, there frequently arise defects or unevenness in the transferred image particularly in the case of thermal transfer of an image having a thin image formation layer.

It is preferable that the number-average grain diameter of the matting agent is larger by 2.5 to 20 μm than the layer thickness of the back layer comprising the binder alone. In the matting agent, at least 5 $mg/m^2$, preferably from 6 to 600 $mg/m^2$, of grains with a diameter of 8 μm or more are necessary. Thus, foreign object damages can be particularly relieved. By using a matting agent having such a narrow grain diameter distribution as giving the coefficient of variation of the grain diameter distribution (σ/rn: calculated by dividing the standard deviation of the grain diameter distribution by the number-average grain diameter) of 0.3 or below, troubles caused by grains having abnormally large diameter can be solved and the desired performance can be established at a smaller addition level. It is still preferable that the coefficient of variation is 0.15 or below.

To prevent the adhesion of foreign materials due to the static electric charge caused by friction with the transport roll, it is preferable that the back layer contains an antistatic agent. As the antistatic agent, use can be made of compounds over a wide scope, for example, cationic surfactants, anionic surfactants, nonionic surfactants, polymeric antistatic agents, conductive fine particles and compounds cited in "11290 no Kagaku Shohin", Kagaku Kogyo Nippo-sha, pp 875–876, etc.

Among the above-described substances, it is preferable to use, as the antistatic agent usable in the back layer, carbon black, a metal oxide such as zinc oxide, titanium oxide or tin oxide or conductive fine grains of an organic semiconductor, etc. It is particularly preferable to use conductive fine grains, since a stable antistatic effect can be achieved regardless of the environment without release of the antistatic agent from the back layer.

To impart coating properties or mold releasing properties, it is also possible to add various activators, or mold-releasing agents such as silicone oil or fluororesins to the back layer.

It is particularly preferable that the back layer has a softening point of 70° C. or below, when measured by TMA (thermomechanical analysis) of the cushion layer and the image receptor layer.

The TMA softening point is determined by heating a subject to be measured at a constant heat-elevating speed under applying a constant load and monitoring the phase of the subject. In the present invention, the temperature at which the phase of the subject begins to change is defined as its TMA softening point. The softening point can be measured by TMA with the use of an apparatus such as Thermoflex (manufactured by Rikagaku Denki).

To stably feed and transport the image receptor sheet, the coefficient of static friction of the back layer surface is controlled to 0.7 or below, preferably 0.4 or below. Also, it is preferable that the surface roughness Rz of the back layer surface is 3 μm or below, still preferably 1 μm or below.

The thermal transfer sheets and the image receptor sheet as described above can be used in forming an image as a laminate wherein the image formation layer of the thermal transfer sheets is superposed on the image receptor layer of the image receptor sheet.

The laminate of the thermal transfer sheets and the image receptor sheet can be formed by various methods. For example, it can be easily obtained by superposing the image formation layer of the thermal transfer sheets on the image receptor layer of the image receptor sheet and then passing through a pressure-heat roller. In this case, it is preferable that the heating temperature is 160° C. or lower or 130° C. or lower.

As another method for obtaining the laminate, use can be appropriately made of the above-described vacuum adhesion method too. In this vacuum adhesion method, the image receptor sheet is first wound around a drum provided with a suction hold for evacuation and then the thermal transfer sheets, which are somewhat larger in size than the image receptor sheet, are adhered to the image receptor sheet in vacuo while uniformly pressing out air with a squeeze roller. Alternatively, use may be made of another method wherein the image receptor sheet is mechanically bonded to a metal drum under stretching and then the thermal transfer sheets are bonded thereto also under mechanically stretching to thereby adhere. Among these methods, the vacuum adhesion method is particularly preferable, since lamination can be quickly and uniformly carried out without resort to temperature control using, for example, a heat roller.

EXAMPLES

Now, the present invention will be described in greater detail by reference to the following Examples. However, it is to be understood that the present invention is not construed as being restricted thereto. Unless otherwise noted, all "parts" given in these Examples are "parts by mass".

<1> Examples 1 to 3 and Comparative Examples 1 and 2

Production of Thermal Transfer Sheet K (Black)

Formation of Back Layers

| [Preparation of coating solution for first back layer] | |
|---|---|
| Aqueous dispersion of acrylic resin (Jurymer ET410, solid content: 20% by mass, manufactured by Nippon Junyaku) | 2 parts |
| Antistatic agent (aqueous dispersion of tin oxide-antimony oxide) (average grain diameter: 0.1 μm, 17% by mass) | 7.0 parts |
| Polyoxyethylene phenyl ether | 0.1 part |
| Melamine compound (Sumitex Resin M-3 manufactured by Sumitomo Chemical) | 0.3 part |
| Distilled water | q.s. to give 100 parts in total. |

[Formation of First Back Layer]

A biaxially oriented polyethylene terephthalate substrate (Ra in both faces: 0.01 μm) of 75 μm in thickness was corona-discharged in one face (back face). Then the coating solution for first back layer was applied to give a dry layer thickness of 0.03 μm and dried at 180° C. for 30 seconds to form the first back layer. Young's modulus in the length direction of the substrate was 450 kg/mm$^2$ (≈4.4 GPa) while Young's modulus in the width direction thereof was 500 kg/mm$^2$ (≈4.9 GPa). The F-5 value in the length direction of the substrate was 10 kg/mm$^2$ (≈98 MPa), while the F-5 value in the width direction of the substrate was 13 kg/mm$^2$ (≈127.4 MPa). The heat shrinkage ratio of the substrate at 100° C. for 30 minutes in the length direction was 0.3%, while that in the width direction was 0.1%. The break strength in the length direction was 20 kg/mm$^2$ (≈196MPa), while that in the width direction was 25 kg/mm$^2$ (≈245 MPa). The modulus of elasticity was 400 kg/mm$^2$ (≈3.9 GPa).

| [Preparation of coating solution for second back layer] | |
|---|---|
| Polyolefin (Chemipearl S-120, solid content: 27% by mass, manufactured by Mitsui Petrochemical Ind.) | 3.0 parts |

-continued

| | |
|---|---|
| Antistatic agent (aqueous dispersion of tin oxide-antimony oxide) (average grain diameter: 0.1 μm, 17% by mass) | 2.0 parts |
| Colloidal silica (Snowtex C, 20% by mass, manufactured by Nissan Chemical Industries) | 2.0 part |
| Epoxy compound (Dynacol EX-614B, manufactured by Nagase Kasei) | 0.3 part |
| Distilled water | q.s. to give 100 parts in total. |

[Formation of Second Back Layer]

The coating solution for second back layer was applied onto the first back layer to give a dry layer thickness of 0.03 μm and then dried at 170° C. for 30 seconds to form the second back layer.

Formation of Photothermal Conversion Layer

[Preparation of Coating Solution for Photothermal Conversion Layer]

The following components were mixed together under stirring with a stirrer to give a coating solution for photothermal conversion layer.

[Composition of coating solution for photothermal conversion layer]

| | |
|---|---|
| IR-absorbing colorant ("NK-2014", manufactured by Nippon Kanko Shikiso, cyanine colorant having the following structure) | 7.6 parts |

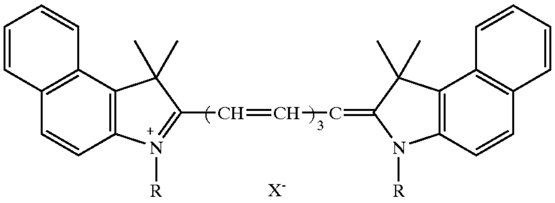

wherein R represents $CH_3$; and X represents $ClO_4$.

| | |
|---|---|
| Polyimide resin of the following structure ("Rikacoat SN-20F", manufactured by New Japan Chemical, heat decomposition temp.: 510° C.) | 29.3 parts |

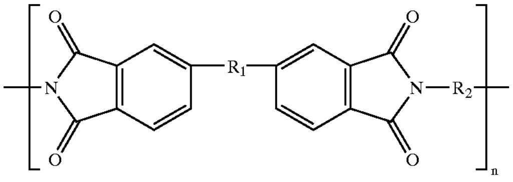

wherein $R_1$ represents $SO_2$; and $R_2$ represents

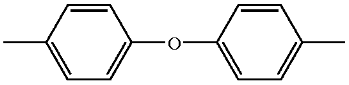

or

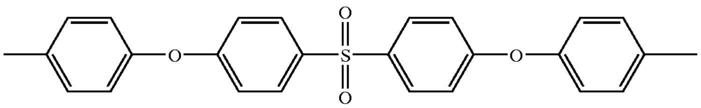

| | |
|---|---|
| Exxon Naphtha | 5.8 parts |
| N-methylpyrrolidone (NMP) | 1500 parts |
| Methyl ethyl ketone | 360 parts |
| Surfactant ("Megafac F-176PF", manufactured by Dainippon Ink & Chemicals, F-type surfactant) | 0.5 part |
| Matting agent dispersion of the following composition | 14.1 parts |

[Matting agent dispersion]

| | |
|---|---|
| N-methyl-2-pyrrolidone (NMP) | 69 parts |
| Methyl ethyl ketone | 20 parts |
| Styrene acrylic resin ("Johncryl 611", manufactured by Johnson Polymer) | 3 parts |
| $SiO_2$ grains ("Seahostar KEP150", silica grains manufactured by Nippon Shokubai). | 8 parts |

[Formation of Photothermal Conversion Layer on Substrate Surface]

The above-described coating solution for photothermal conversion layer was applied with a wire bar onto one surface of a polyethylene terephthalate film (substrate) of 75 μm in thickness. Then the coated matter was dried in an oven at 120° C. for 2 minutes so as to form a photothermal conversion layer on the substrate. The optical density of the thus obtained photothermal conversion layer at a wavelength of 808 nm measured with the use of an UV-spectrophotometer model UV-240 (manufactured by Shimadzu) was OD=1.03. As the results of scanning electron microscopic observation of the sections of the photothermal conversion layer, it was found out that the average layer thickness was 0.3 μm.

Formation of Image Formation Layer

[Preparation of Coating Solution for Black Image Formation Layer]

The following components were fed into a mill of a kneader and subjected to a pre-dispersion treatment by applying a shear force while adding a solvent in portions. To the obtained dispersion was further added the solvent to give the following composition finally. Then it was dispersed in a sand mill for 2 hours to give a pigment dispersion mother liquor.

| | |
|---|---|
| [Composition of black pigment dispersion mother liquor] | |
| Composition 1: | |
| Polyvinyl butylal | 12.6 parts |
| ("S-LEC B-BL-SH", manufactured by Sekisui Chemicals) | |
| Pigment Black 7 (carbon black C.I. No. 77266) | 4.5 parts |
| ("Mitsubishi Carbon Black #5", manufactured by Mitsubishi Chemical, PVC blackness: 1) | |
| Dispersion aid | 0.8 part |
| ("Solsperse S-20000", manufactured by ICI) | |
| n-Propyl alcohol | 79.4 parts. |
| Composition 2: | |
| Polyvinyl butylal | 12.6 parts |
| ("S-LEC B-BL-SH", manufactured by Sekisui Chemicals) | |
| Pigment Black 7 (carbon black C.I. No. 77266) | 10.5 parts |
| ("Mitsubishi Carbon Black MA100", manufactured by Mitsubishi Chemical, PVC blackness: 10) | |
| Dispersion aid | 0.8 part |
| ("Solsperse S-20000", manufactured by ICI) | |
| n-Propyl alcohol | 79.4 parts. |

Next, the following components are mixed together under stirring with a stirrer to give a coating solution for black image formation layer.

| | |
|---|---|
| [Composition of coating solution for black image formation layer] | |
| Above black pigment dispersion mother liquor | 185.7 parts |
| composition 1 : composition 2 = 70 : 30 (parts) | |
| Polyvinyl butylal | 11.9 parts |
| ("S-LEC B BL-SH", manufactured by Sekisui Chemical) | |
| Wax type compounds | |
| (Stearic acid amide "Neutron 2", manufactured Nippon Fine Chemical) | 1.7 parts |
| (Behenic acid amide "Diamid BM", manufactured by Nippon Kasei Chemical) | 1.7 parts |
| (Lauric acid amide "Diamid Y", manufactured by Nippon Kasei Chemical) | 1.7 parts |
| (Palmitic acid amide "Diamid KP", manufactured by Nippon Kasei Chemical) | 1.7 parts |

-continued

| | |
|---|---|
| (Erucic acid amide "Diamid L-200", manufactured by Nippon Kasei Chemical) | 1.7 parts |
| (Oleic acid amide "Diamid O-200", manufactured by Nippon Kasei Chemical) | 1.7 parts |
| Rosin | 11.4 parts |
| ("KE-311", manufactured by Arakawa Chemical Industries) (Composition: resin acids 80 to 97%; resin acid composition: abietic acid 30 to 40%, neoabietic acid 10 to 20%, dihydroabietic acid 14%, tetrahydroabietic acid 14%) | |
| Surfactant | 2.1 parts |
| ("Megafac F-176PF", solid content: 20%, manufactured by Dainippon Ink & Chemicals) | |
| Inorganic pigment | 7.1 parts |
| ("MEK-ST", 30% methyl ethyl ketone solution, manufactured by Nissan Chemical Industries) | |
| n-Propyl alcohol | 1050 parts |
| Methyl ethyl ketone | 295 parts. |

When the grains in the coating solution for black image formation layer thus obtained were measured by using a laser scattering grain size distribution meter, the average grain size was 0.25 μm and the ratio of grains of 1 μm or above was 0.5%.

[Formation of Black Image Formation Layer on Photothermal Conversion Layer Surface]

The above-described coating solution for black image formation layer was applied with a wire bar onto one surface of the above-described photothermal conversion layer and then the coated matter was dried in an oven at 100° C. for 2 minutes so as to form a black image formation layer on the photothermal conversion layer. Thus, a thermal transfer sheet having the photothermal conversion layer and the black image formation layer formed in this order on the substrate (hereinafter referred to as the thermal transfer sheet K, similarly, those having a yellow image formation layer, a magenta image formation layer and a cyan image formation layer will be referred as respectively to thermal transfer sheet Y, thermal transfer sheet M and thermal transfer sheet C) was constructed.

The optical density (permeation optical density: OD) of the thermal transfer sheet K measured with the use of a Macbeth densitometer "TD-904" (W filter) was OD=0.91. The average layer thickness of the black image formation layer was 0.60 μm.

The physical properties of the image formation layer thus obtained were as follows.

The surface hardness of the image formation layer measured with the use of a sapphire stylus, which is preferably 10 g or above, was 200 g or above in practice.

The smooster value of the surface at 23° C. under 55% RH, which is preferably from 0.5 to 50 mmHg (≈0.0665 to 6.65 kPa), was 9.3 mmHg (≈1.24 kPa) in practice.

The coefficient of static friction of the surface, which is preferably 0.2 or below, was 0.08 in practice.

Production of Thermal Transfer Sheet Y

A thermal transfer sheet Y was produced in the same manner as in producing the thermal transfer sheet K but using a coating solution for yellow thermal transfer sheet having the following composition as a substitute for the coating solution for black thermal transfer sheet employed in producing the thermal transfer sheet K as described above. The layer thickness of the image formation layer in the thus obtained thermal transfer sheet Y was 0.42 μn.

| [Composition of yellow pigment dispersion mother liquor] Yellow pigment composition 1: | |
|---|---|
| Polyvinyl butylal ("S-LEC B-BL-SH", manufactured by Sekisui Chemicals) | 7.1 parts |
| Pigment Yellow 180 (C.I. No. 21290) ("Novoperm Yellow P-HG", manufactured by Clariant Japan) | 12.9 parts |
| Dispersion aid ("Solsperse S-20000", manufactured by ICI) | 0.6 part |
| n-Propyl alcohol | 79.4 parts. |
| [Composition of yellow pigment dispersion mother liquor] Yellow pigment composition 2: | |
| Polyvinyl butylal ("S-LEC B-BL-SH", manufactured by Sekisui Chemicals) | 7.1 parts |
| Pigment Yellow 139 (C.I. No. 56298) ("Novoperm Yellow M2R 70", manufactured by Clariant Japan) | 12.9 parts |
| Dispersion aid ("Solsperse S-20000", manufactured by ICI) | 0.6 part |
| n-Propyl alcohol | 79.4 parts. |
| [Composition of coating solution for yellow image formation layer] | |
| Above yellow pigment dispersion mother liquor composition 1 : composition 2 = 95 : 5 (parts) | 126 parts |
| Polyvinyl butylal ("S-LEC B BL-SH", manufactured by Sekisui Chemical) | 4.6 parts |
| Wax type compounds | |
| (Stearic acid amide "Neutron 2", manufactured Nippon Fine Chemical) | 0.7 part |
| (Behenic acid amide "Diamid BM", manufactured by Nippon Kasei Chemical) | 0.7 part |
| (Lauric acid amide "Diamid Y", manufactured by Nippon Kasei Chemical) | 0.7 part |
| (Palmitic acid amide "Diamid KP", manufactured by Nippon Kasei Chemical) | 0.7 part |
| (Erucic acid amide "Diamid L-200", manufactured by Nippon Kasei Chemical) | 0.7 part |
| (Oleic acid amide "Diamid O-200", manufactured by Nippon Kasei Chemical) | 0.7 part |
| Nonionic surfactant ("Chemistat 1100" manufactured by Sanyo Kasei) | 0.4 part |
| Rosin ("KE-311", manufactured by Arakwa Chemical Industries) (Composition: resin acids 80 to 97%; resin acid composition: abietic acid 30 to 40%, neoabietic acid 10 to 20%, dihydroabietic acid 14%, tetrahydroabietic acid 14%) | 2.4 parts |
| Surfactant ("Megafac F-176PF", solid content: 20%, manufactured by Dainippon Ink & Chemicals) | 0.8 part |
| n-Propyl alcohol | 793 parts |
| Methyl ethyl ketone | 198 parts. |

The physical properties of the image formation layer thus obtained were as follows.

The surface hardness of the image formation layer measured with the use of a sapphire stylus, which is preferably 10 g or above, was 200 g or above in practice.

The smooster value of the surface at 23° C. under 55% RH, which is preferably from 0.5 to 50 mmHg (≈0.0665 to 6.65 kPa), was 2.3 mmHg (≈0.31 kPa) in practice.

The coefficient of static friction of the surface, which is preferably 0.2 or below, was 0.1 in practice.

Production of Thermal Transfer Sheet M

A thermal transfer sheet M was produced in the same manner as in producing the thermal transfer sheet K but using a coating solution for magenta thermal transfer sheet having the following composition as a substitute for the coating solution for black thermal transfer sheet employed in producing the thermal transfer sheet K as described above. The layer thickness of the image formation layer in the thus obtained thermal transfer sheet M was 0.38 μm.

| [Composition of magenta pigment dispersion mother liquor] Magenta pigment composition 1: | |
|---|---|
| Polyvinyl butylal ("Denka Butylal #2000-L", manufactured by Denki Kagaku Kogyo, Vicat softening point: 57° C.) | 12.6 parts |
| Pigment Red 57:1 (C.I. No. 15850:1) ("Symuler Brilliant Carmine 6B-299", manufactured by Dainippon Ink & Chemicals) | 15.0 parts |
| Dispersion aid ("Solsperse S-20000", manufactured by ICI) | 0.6 part |
| n-Propyl alcohol | 80.4 parts. |
| [Composition of magenta pigment dispersion mother liquor] Magenta pigment composition 2: | |
| Polyvinyl butylal ("Denka Butylal #2000-L", manufactured by Denki Kagaku Kogyo, Vicat softening point: 57° C.) | 12.6 parts |
| Pigment Red 57:1 (C.I. No. 15850:1) ("Lionol Red 6B-4290G", manufactured by Toyo Ink) | 15.0 parts |
| Dispersion aid ("Solsperse S-20000", manufactured by ICI) | 0.6 part |
| n-Propyl alcohol | 79.4 parts. |
| [Composition of coating solution for magenta image formation layer] | |
| Above magenta pigment dispersion mother liquor composition 1 : composition 2 = 95 : 5 (parts) | 163 parts |
| Polyvinyl butylal ("Denka Butylal #2000-L", manufactured by Denki Kagaku Kogyo, Vicat softening point: 57° C.) | 4.0 parts |
| Wax type compounds | |
| (Stearic acid amide "Neutron 2", manufactured Nippon Fine Chemical) | 1.0 part |
| (Behenic acid amide "Diamid BM", manufactured by Nippon Kasei Chemical) | 1.0 part |
| (Lauric acid amide "Diamid Y", manufactured by Nippon Kasei Chemical) | 1.0 part |
| (Palmitic acid amide "Diamid KP", manufactured by Nippon Kasei Chemical) | 1.0 part |
| (Erucic acid amide "Diamid L-200", manufactured by Nippon Kasei Chemical) | 1.0 part |
| (Oleic acid amide "Diamid O-200", manufactured by Nippon Kasei Chemical) | 1.0 part |
| Nonionic surfactant ("Chemistat 1100", manufactured by Sanyo Kasei) | 0.7 part |
| Rosin ("KE-311", manufactured by Arakwa Chemical Industries) (Composition: resin acids 80 to 97%; resin acid composition: abietic acid 30 to 40%, neoabietic acid 10 to 20%, dihydroabietic acid 14%, tetrahydroabietic acid 14%) | 4.6 parts |
| Pentaerythritol tetraacrylate ("NK Ester A-TMMT", manufactured by Shin Nakamura Kagaku) | 2.5 parts |
| Surfactant ("Megafac F-176PF", solid content: 20%, manufactured by Dainippon Ink & Chemicals) | 1.3 part |
| n-Propyl alcohol | 848 parts |
| Methyl ethyl ketone | 246 parts. |

The physical properties of the image formation layer thus obtained were as follows.

The surface hardness of the image formation layer measured with the use of a sapphire stylus, which is preferably 10 g or above, was 200 g or above in practice.

The smooster value of the surface at 23° C. under 55% RH, which is preferably from 0.5 to 50 mmHg (≈0.0665 to 6.65 kPa), was 3.5 mmHg (≈0.47 kPa) in practice.

The coefficient of static friction of the surface, which is preferably 0.2 or below, was 0.08 in practice.

Production of Thermal Transfer Sheet C

A thermal transfer sheet C was produced in the same manner as in producing the thermal transfer sheet K but using a coating solution for cyan thermal transfer sheet having the following composition as a substitute for the coating solution for black thermal transfer sheet employed in producing the thermal transfer sheet K as described above. The layer thickness of the image formation layer in the thus obtained thermal transfer sheet C was 0.45 μm.

| | |
|---|---|
| [Composition of cyan pigment dispersion mother liquor] | |
| Cyan pigment composition 1: | |
| Polyvinyl butylal | 12.6 parts |
| ("S-LEC B-BL-SH", manufactured by Sekisui Chemicals) | |
| Pigment Blue 15:4 (C.I. No. 74160) | 15.0 parts |
| ("Cyanine Blue 700-10FG", manufactured by Toyo Ink) | |
| Dispersion aid | 0.8 part |
| ("PW-36", manufactured by Kusumoto Chemicals) | |
| n-Propyl alcohol | 110 parts. |
| [Composition of cyan pigment dispersion mother liquor] | |
| Cyan pigment composition 2: | |
| Polyvinyl butylal | 12.6 parts |
| ("S-LEC B-BL-SH", manufactured by Sekisui Chemicals) | |
| Pigment Blue 15 (C.I. No. 74160) | 15.0 parts |
| ("Lionol Blue 7027", manufactured by Toyo Ink) | |
| Dispersion aid | 0.8 part |
| ("PW-36", manufactured by Kusumoto Chemicals) | |
| n-Propyl alcohol | 110 parts. |
| [Composition of coating solution for cyan image formation layer] | |
| Above cyan pigment dispersion mother liquor | 118 parts |
| cyan pigment composition 1 : cyan pigment composition 2 = 90 : 10 (parts) | |
| Polyvinyl butylal | 5.2 parts |
| ("S-LEC B-BL-SH", manufactured by Sekisui Chemicals) | |
| Wax type compounds | |
| (Stearic acid amide "Neutron 2", manufactured Nippon Fine Chemical) | 1.0 part |
| (Behenic acid amide "Diamid BM", manufactured by Nippon Kasei Chemical) | 1.0 part |
| (Lauric acid amide "Diamid Y", manufactured by Nippon Kasei Chemical) | 1.0 part |
| (Palmitic acid amide "Diamid KP", manufactured by Nippon Kasei Chemical) | 1.0 part |
| (Erucic acid amide "Diamid L-200", manufactured by Nippon Kasei Chemical) | 1.0 part |
| (Oleic acid amide "Diamid O-200", manufactured by Nippon Kasei Chemical) | 1.0 part |
| Rosin | 2.8 parts |
| ("KE-311", manufactured by Arakwa Chemical Industries) | |
| (Composition: resin acids 80 to 97%; resin acid composition: abietic acid 30 to 40%, neoabietic acid 10 to 20%, dihydroabietic acid 14%, tetrahydroabietic acid 14%) | |
| Pentaerythritol tetraacrylate | 1.7 parts |
| ("NK Ester A-TMMT", manufactured by Shin Nakamura Kagaku) | |
| Surfactant | 1.7 part |
| ("Megafac F-176PF", solid content: 20%, manufactured by Dainippon Ink & Chemicals) | |
| n-Propyl alcohol | 890 parts |
| Methyl ethyl ketone | 247 parts. |

The physical properties of the image formation layer thus obtained were as follows.

The surface hardness of the image formation layer measured with the use of a sapphire stylus, which is preferably 10 g or above, was 200 g or above in practice.

The smooster value of the surface at 23° C. under 55% RH, which is preferably from 0.5 to 50 mmHg (≈0.0665 to 6.65 kPa), was 7.0 mmHg (≈0.93 kPa) in practice.

The coefficient of static friction of the surface, which is preferably 0.2 or below, was 0.08 in practice.

Production of Image Receptor Sheet R

The following coating solutions A and B respectively for cushion layer and image receptor layer were prepared.

| | |
|---|---|
| 1) Coating solution for cushion layer | |
| Vinyl chloride-vinyl acetate copolymer (main binder) | 20 parts |
| ("MPR-TSL"manufactured by Nisshin Kagaku) | |
| Plasticizer | 10 parts |
| ("Paraplex G-40" manufactured by CP. HALL. COMPANY) | |
| Surfactant (fluorinated: coating aid) | 0.5 part |
| ("Megafac F-177" manufactured by Dainippon Ink & Chemicals) | |
| Antistatic agent (quaternary ammonium salt) | 0.3 part |
| ("SAT-5 Supper (IC)" manufactured by Nihon Junyaku) | |
| Methyl ethyl ketone | 60 parts |
| Toluene | 10 parts |
| N,N-Dimethylformamide | 3 parts |
| 2) Coating solution A for image receptor layer | |
| Polyvinyl butylal | 8 parts |
| ("S-LEC B-BL-SH", manufactured by Sekisui Chemicals) | |
| Antistatic agent | 0.7 part |
| ("Sunstat 2012A"manufactured by Sanyo Kasei) | |
| Surfactant (fluorinated: coating aid) | 0.1 part |
| ("Megafac F-177" manufactured by Dainippon Ink & Chemicals) | |
| n-Propyl alcohol | 20 parts |
| Methanol | 20 parts |
| 1-Methoxy-2-propanol | 50 parts. |

To the coating solution A for image receptor layer was further added 0.5 part by mass of polymethyl methacrylate grains ("MX500" manufactured by Soken Kagaku) of5 μm in grain diameter.

Using a small-size coater, the above-described coating solution for cushion layer was applied on a transparent PET substrate having a thickness of 100 μm. After drying the coated layer, the coating solution A for image receptor layer was further applied and dried. The coating doses were controlled so as to give a layer thickness of the cushion layer of about 20 μm and a layer thickness of the image receptor layer of about 2 μm after drying.

The smooster value of the surface of the obtained image receptor layer at 23° C. under 55% RH, which is preferably from 0.5 to 50 mmHg (≈0.0665 to 6.65 kPa), was 0.83 mmHg (≈0.11 kPa) in practice.

Further, image receptor sheets R having a back layer on the face of the substrate opposite to the face having the cushion layer and the image receptor layer were constructed. There three types of back layers including the sheet having no back layer.

TABLE 1

| | |
|---|---|
| a | Using coating solution for back layer employed in thermal transfer sheet |
| b | Neither first layer nor second layer in "a" containing conductive metal oxide grains |
| c | No |

The image receptor sheets R and thermal transfer sheets (K, M, C and Y) produced above were surface-cleaned and laminated in the order of feeding/transporting. Each set of the laminate was packaged and stored at room temperature for 1 week. Then, it was employed in laser-recording an image as follows.

Formation of Transferred Image

The above-described recording medium package was opened and a set of the laminate composed of the image receptor sheet and the thermal transfer sheets was set into a recording medium cassette as such. Then the cassette was attached to the recording medium feeding unit in a recorder and image recording was performed. As the recorder, use was made of "Plate Setter Spectrum" manufactured by Creo Scitex.

First, the image receptor sheet R (56 cm×79 cm) was picked up from the recording medium cassette and transported. Then it was adsorbed in vacuo by a rotary drum for recording of 38 cm in diameter provided with vacuum section holes of 1 mm in diameter (face density: 1 hole/3 cm×8 cm). Next, the thermal transfer sheet K (61 cm×84 cm) was transported from the recording medium cassette and superposed on the above-described image receptor sheet so as to uniformly stick out from over the image receptor sheet. Then these sheets were squeezed with a squeeze roller and thus adhered and laminated in such a manner that air was sucked into the section holes. The degree of evacuation in the state that the section holes were closed was −150 mmHg (≈81.13 kPa) per atm. Then the above-described drum was rotated and semiconductor laser beams of 808 nm in wavelength were concentrated onto the surface of the laminate on the drum to give spots of 7 $\mu$m on the photothermal conversion layer surface. The laser beams were shifted at right angles (sub scanning direction) to the rotational direction of the drum (i.e., the main scanning direction) and thus the laser image (lines) was recorded on the laminate. The laser irradiation conditions were as follows. In this example, use was made of laser beams consisting of multilaser beam two-dimensional arrangement having pallalelograms 5 columns in the main scanning direction and 3 columns in the sub scanning direction.

| | |
|---|---|
| Laser power | 110 mW |
| Drum rotational speed | 500 rpm |
| Sub scanning pitch | 6.35 $\mu$m |

Environmental temperature/humidity 3 conditions: 18° C. 30%, 23° C. 55%, 26° C. 65%.

The diameter of the exposure drum, which is preferably 360 mm or above, was 380 mm in practice.

The image was 515 mm×728 mm in size and 2600 dpi in resolution.

After the completion of the above-described laser recording, the laminate was taken off from the drum and the thermal transfer sheet K was removed manually from the image receptor sheet. Thus it was confirmed that the irradiated regions in the image formation layer of the thermal transfer sheet K alone had been transferred from the thermal transfer sheet K to the image receptor sheet. Similarly, images were transferred from the above-described thermal transfer sheets Y, M and C to the image receptor sheet.

Table 2 shows the image receptor sheets employed in image recording.

TABLE 2

| | Recording | Image receptor face | | | | Back face | | | |
|---|---|---|---|---|---|---|---|---|---|
| | medium cassette Utilization | Image receptor layer | Coefficient of static friction | Rz ($\mu$) | SR (Ω) | Back layer | Coefficient of static friction | Rz ($\mu$) | SR (Ω) |
| Ex. 1 | Yes | A | 0.53 | 0.4 | $2 \times 10^{13}$ | a | 0.35 | 0.10 | $3 \times 10^{8}$ |
| Ex. 2 | Yes | B | 0.25 | 3.2 | $2 \times 10^{13}$ | a | 0.35 | 0.10 | $3 \times 10^{8}$ |
| Ex. 3 | Yes | A | 0.53 | 0.4 | $2 \times 10^{13}$ | b | 0.36 | 0.12 | $4 \times 10^{13}$ |
| C.Ex.1 | Yes | A | 0.53 | 0.4 | $2 \times 10^{13}$ | c | 0.85 | 0.10 | $5 \times 10^{13}$ |
| C.Ex.2 | No | A | 0.53 | 0.4 | $2 \times 10^{13}$ | a | 0.35 | 0.10 | $3 \times 10^{8}$ |

In Comparative Example 2, the sheets were manually set one by one into the drum without using the recording medium cassette.

The coefficient of static friction was measured by the following method.

An image receptor sheet sample (5 cm×20 cm) is bonded onto a table. Using a pressure-sensitive adhesive tape (for example, a polyester pressure-sensitive adhesive tape No. 31B75 High, manufactured by Nitto Denko), the substrate of the image receptor sheet is adhered to the table (i.e., the image receptor layer being upward). A stainless terminal (35 mm×75 mm, curved face of 2.5 mmr, 200 g) having smooth surface is placed on the image receptor layer and then the table is slowly inclined. The tilt angle θ is measured at the point that the above-described stainless terminal begins to slip. The coefficient of static friction is expressed in tan θ.

Evaluation

1) Material Transport Properties

The image receptor sheet was transported from the recording medium feeding unit to the rotary drum for recording 20 times and the material transport properties were thus evaluated in accordance with the following criteria.

○: Stable transportation without positioning error or jamming.

X: Showing positioning error or jamming.

2) Defect in Image

The transferred image was observed with the naked eye and defects in the image (white spots, etc.) caused by foreign materials were counted. Thus evaluation was made in accordance with the following criteria.

○: $1/m^2$ or less.

Δ: 2 to $10/m^2$.

X: $11/m^2$ or more.

3) Resolution Power

An image having 2% dots and 98% dots was recorded and the reproduction of the desired dot image was evaluated:

○: Reproducible (both of 2% and 98% dots).

X: Not reproducible (not reproducible in either 2% or 98% dots).

Table 3 summarizes the evaluation data.

TABLE 3

| | Material transport properties | Defect in image | Resolution power |
|---|---|---|---|
| Ex. 1 | ○ | ○ | ○ |
| Ex. 2 | ○ | ○ | Δ |
| Ex. 3 | ○ | Δ | ○ |
| C. Ex. 1 | X | Δ | ○ |
| C. Ex. 2 | X | X | ○ |

Thus, it can be understood that images with less defects could be obtained with favorable material transport properties in Examples. In particular, favorable material transport properties cannot be achieved until the recording medium cassette containing sheets laminated in the order of feeding is employed and, at the same time, the coefficient of static friction of the back layer surface of the image receptor layer is at a definite level (0.7 or less), i.e., both being the characteristics of the present invention.

The four color images transferred in Examples 1 to 3 were further transferred onto recording paper to form multicolor images. As a result, multicolor images having excellent image qualities and stable transfer density could be formed even in case of high energy laser recording with laser beams in two-dimensional multibeam arrangement under different temperature/humidity conditions.

To transfer onto paper, use was made of a thermal transfer apparatus provided with an insertion table having a coefficient of dynamic friction to the polyethylene terephthalate material of 0.1 to 0.7 and showing a transport speed of 15 to 50 mm/sec. The Vickers hardness of the heat roll material in this thermal transfer apparatus, which is preferably from 10 to 100, was 70 in practice.

The obtained images were favorable under all of the three environmental temperature/humidity conditions.

Examples 4 to 6 and Comparative Examples 3 and 4

(I)—Production of Thermal Transfer Sheet C

Formation of Back Layer

After optionally corona-discharging a polyethylene terephthalate substrate (Ra in both faces: 0.01 μm) of 100 μm in thickness in one face (back face), back layers were formed if needed. Young's modulus in the length direction of the substrate was 450 kg/mm$^2$ (≈4.4 GPa) while Young's modulus in the width direction thereof was 500 kg/mm$^2$ (≈4.9 GPa). The F-5 value in the length direction of the substrate was 10 kg/mm$^2$ (≈98 MPa), while the F-5 value in the width direction of the substrate was 10 kg/mm$^2$ (≈98 MPa). The heat shrinkage ratio of the substrate at 100° C. for 30 minutes in the length direction was 0.3%, while that in the width direction was 0.1%. The break strength in the length direction was 20 kg/mm$^2$ (≈196 MPa), while that in the width direction was 25 kg/mm$^2$ (≈245 MPa). The modulus of elasticity was 400 kg/mm$^2$ (≈3.9 GPa).

In case of forming back layers, either the following back layers a or b was formed.

a) Back Layer a

[Formation of First Back Layer]

On one face of the corona-discharged PET substrate, the same coating solution for first back layer as the one employed in Example 1 was applied to give a dry layer thickness of 0.03 μm and dried at 180° C. for 30 seconds to give a first back layer.

[Formation of Second Back Layer]

On the first back layer, the same coating solution for second back layer as the one employed in Example 1 was applied to give a dry layer thickness of 0.03 μm and dried at 170° C. for 30 seconds to give a second back layer.

b) Back Layer b

First and second back layers were formed as in the above back layer 1 but adding the antistatic agent (aqueous dispersion of tin oxide-antimony oxide) to neither the first back layer nor the second back layer.

1) Coating Solutions A and B for Photothermal Conversion Layer

A coating solution having the same composition as the coating solution for photothermal conversion layer employed in Example 1 was referred to a coating solution A for photothermal conversion layer. Moreover, a coating solution for photothermal conversion layer having the same composition as the coating solution A for photothermal conversion layer but substituting the $SiO_2$ grains ("Seahostar KEP 150": silica grains manufactured by Nippon Shokubai) in the matting agent dispersion in the coating solution A for photothermal conversion layer by polymethyl methacrylate grains ("MX500" manufactured by Nippon Shokubai) of a grain diameter of 5 μm was referred to as another coating solution B for photothermal conversion layer.

2) Formation of Photothermal Conversion Layer on Substrate Surface

The above-described coating solution A or B for photothermal conversion layer was applied with a wire bar onto one surface (the opposite face to the back layer if provided) of a polyethylene terephthalate substrate of 100 μm in thickness. Then the coated matter was dried in an oven at 120° C. for 2 minutes so as to form a photothermal conversion layer on the substrate. The optical density of the thus obtained photothermal conversion layer at a wavelength of 808 nm measured with the use of an UV-spectrophotometer model UV-240 (manufactured by Shimadzu) was OD=1.03. As the results of scanning electron microscopic observation of the sections of the photothermal conversion layer, it was found out that the average layer thickness was 0.3 μm.

3) Formation of Cyan Image Formation Layer on Photothermal Conversion Layer Surface On the surface of the above-described photothermal conversion layer, a coating solution for cyan image formation layer having the same composition as in Example 1 was applied with a wire bar. Then the coated matter was dried in an oven at 100° C. for 2 minutes so as to form a cyan image formation layer on the photothermal conversion layer.

The physical properties of the image formation layer thus obtained were as follows.

The surface hardness of the image formation layer measured with the use of a sapphire stylus, which is preferably 10 g or above, was 200 g or above in practice.

The smooster value of the surface at 23° C. under 55% RH, which is preferably from 0.5 to 50 mmHg (≈0.0665 to 6.65 kPa), was 7.0 mmHg (≈0.93 kPa) in practice.

By these steps, a thermal transfer sheet C (cyan) having the photothermal conversion layer and the cyan image formation layer formed in this order on the substrate was constructed.

The optical density (OD) of the thermal transfer sheet C measured with the use of a Macbeth densitometer "TD-904" (W filter) was OD=0.91. The average layer thickness of the cyan image formation layer was 0.45 μm.

Production of Image Receptor Sheet

Using a small-size coater, a coating solution for cushion layer having the same composition as in Example 1 was applied on a white PET substrate ("Lumirror #130E58" manufactured by Toray, thickness 130 μm). After drying the coated layer, a coating solution for image receptor layer having the same composition as the coating solution A for image receptor layer used in Example 1 was further applied and dried. The coating doses were controlled so as to give a layer thickness of the cushion layer of about 20 μm and a layer thickness of the image receptor layer of about 2 μm after drying. The white PET substrate was a laminate (total thickness: 130 μm, specific gravity: 0.8) composed of a void-containing polyethylene terephthalate layer (thickness: 116 m, porosity: 20%) and titanium oxide-containing polyethylene terephthalate layers (thickness: 7 μm, titanium oxide content: 2%) provided on both faces of the substrate. The thus produced material was stored at room temperature for 1 week and then employed in laser recording an image.

The physical properties of the image receptor layer thus obtained were as follows.

The surface roughness Ra of the image receptor layer, which is preferably 0.4 to 0.1 μm, was 0.02 μm in practice.

The surface waviness of the image receptor layer, which is preferably 2 μm or less, was 1.2 μm in practice.

The smooster value of the image receptor layer surface at 23° C. under 55% RH, which is preferably from 0.5 to 50 mmHg (≈0.0665 to 6.65 kPa), was 0.8 mmHg (≈0.11 kPa) in practice.

The coefficient of static friction of the image receptor layer surface, which is preferably 0.8 or below, was 0.37 in practice.

The image receptor sheets and thermal transfer sheets C produced above were surface-cleaned and laminated in the order of feeding/transporting. Each set of the laminate was packaged and stored at room temperature for 1 week. Then, it was employed in laser-recording an image as follows.

Formation of Transferred Image

The above-described recording medium package was opened and a set of the laminate composed of the image receptor sheet and the thermal transfer sheets was set into a recording medium cassette as such. Then the cassette was attached to the recording medium feeding unit in a recorder and image recording was performed. As the recorder, use was made of "Plate Setter Spectrum" manufactured by Creo Scitex.

First, the image receptor sheet (56 cm×79 cm) was picked up from the recording medium cassette and transported. Then it was adsorbed in vacuo by a rotary drum for recording of 38 cm in diameter provided with vacuum section holes of 1 mm in diameter (face density: 1 hole/3 cm×8 cm). Next, the thermal transfer sheet C (61 cm×84 cm) was transported from the recording medium cassette and superposed on the above-described image receptor sheet so as to uniformly stick out from over the image receptor sheet. Then these sheets were squeezed with a squeeze roller and thus adhered and laminated in such a manner that air was sucked into the section holes. The degree of evacuation in the state that the section holes were closed was −150 mmHg (≈81.13 kPa) per atm. Then the above-described drum was rotated and semiconductor laser beams of 808 nm in wavelength were concentrated onto the surface of the laminate on the drum to give spots of 7 μm on the photothermal conversion layer surface. The laser beams were shifted at right angles (sub scanning direction) to the rotational direction of the drum (i.e., the main scanning direction) and thus the laser image (lines) was recorded on the laminate. The laser irradiation conditions were as follows. In this example, use was made of laser beams consisting of multilaser beam two-dimensional arrangement having pallalelograms 5 columns in the main scanning direction and 3 columns in the sub scanning direction.

| | |
|---|---|
| Laser power | 110 mW |
| Drum rotational speed | 500 rpm |
| Sub scanning pitch | 6.35 μm |

Environmental temperature/humidity 3 conditions: 18° C. 30%, 23° C. 55%, 26° C. 65%.

The diameter of the exposure drum, which is preferably 360 mm or above, was 380 mm in practice.

The image was 515 mm×728 mm in size and 2600 dpi in resolution.

After the completion of the above-described laser recording, the laminate was taken off from the drum and the thermal transfer sheet C was removed manually from the image receptor sheet. Thus it was confirmed that the irradiated regions in the image formation layer of the thermal transfer sheet C alone had been transferred from the thermal transfer sheet C to the image receptor sheet.

Table 4 shows the thermal transfer sheets C employed in image recording.

TABLE 4

| | Recording medium cassette Utilization | Image formation surface: Photothermal conversion layer | Image formation surface: Coefficient of static friction | Image formation surface: Rz (μ) | Back layer surface: Back layer | Back layer surface: Coefficient of static friction | Back layer surface: Rz (μ) | Back layer surface: SR (Ω) |
|---|---|---|---|---|---|---|---|---|
| Ex. 4 | Yes | A | 0.08 | 0.8 | a | 0.35 | 0.10 | $3 \times 10^8$ |
| Ex. 5 | Yes | B | 0.06 | 3.6 | a | 0.35 | 0.10 | $3 \times 10^8$ |
| Ex. 6 | Yes | A | 0.08 | 0.8 | b | 0.36 | 0.12 | $4 \times 10^{13}$ |
| C.Ex.3 | Yes | A | 0.08 | 0.8 | no | 0.85 | 0.10 | $5 \times 10^{13}$ |
| C.Ex.4 | No | A | 0.08 | 0.8 | a | 0.35 | 0.10 | $3 \times 10^8$ |

Evaluation

1) Material Transport Properties

The image receptor sheet was transported from the recording medium feeding unit to the rotary drum for recording 20 times and the material transport properties were thus evaluated in accordance with the following criteria.

○: Stable transportation without positioning error or jamming.

X: Showing positioning error or jamming.

2) Defect in Image

The transferred image was observed with the naked eye and defects in the image (white spots, etc.) caused by foreign materials were counted. Thus evaluation was made in accordance with the following criteria.

○: 1/m$^2$ or less.

Δ: 2 to 10/m$^2$.

X: 11/m$^2$ or more.

3) Resolution Power

An image having 2% dots and 98% dots was recorded and the reproduction of the desired dot image was evaluated:

○: Reproducible (both of 2% and 98% dots).

X: Not reproducible (not reproducible in either 2% or 98% dots).

Table 5 summarizes the evaluation data.

TABLE 5

| | Material transport properties | Defect in image | Resolution power |
|---|---|---|---|
| Ex. 4 | ○ | ○ | ○ |
| Ex. 5 | ○ | ○ | Δ |
| Ex. 6 | ○ | Δ | ○ |
| C. Ex. 3 | X | Δ | ○ |
| C. Ex. 4 | X | X | ○ |

(II) Thermal transfer sheets K (black), Y (yellow) and M (magenta) were produced with the use of the same composition as employed in producing the thermal transfer sheet C (cyan) but changing the coating solution for image formation layer.

Thermal Transfer Sheet K (Black)

Use was made of a coating solution for black image formation layer having the same composition as employed Example 1. The thickness of the image formation layer in the thermal transfer sheet K thus obtained was 0.60 μm.

Thermal Transfer Sheet Y (Yellow)

Use was made of a coating solution for yellow image formation layer having the same composition as employed Example 1. The thickness of the image formation layer in the thermal transfer sheet Y thus obtained was 0.42 μm.

Thermal Transfer Sheet M (Magenta)

Use was made of a coating solution for magenta image formation layer having the same composition as employed Example 1. The thickness of the image formation layer in the thermal transfer sheet M thus obtained was 0.38 μm.

Table 6 shows the physical properties of the image formation layer surfaces and back layer surfaces in the thermal transfer sheets K, Y and M thus produced.

TABLE 6

| | Image formation surface | | | Back layer surface | | | |
|---|---|---|---|---|---|---|---|
| | Photothermal conversion layer | Coefficient of static friction | Rz (μ) | Back layer | Coefficient of static friction | Rz (μ) | SR (Ω) |
| Thermal transfer sheet K | A | 0.08 | 0.7 | a | 0.35 | 0.1 | $3 \times 10^8$ |
| Thermal transfer sheet Y | A | 0.10 | 0.8 | a | 0.35 | 0.1 | $3 \times 10^8$ |
| Thermal transfer sheet M | A | 0.08 | 0.9 | a | 0.35 | 0.1 | $3 \times 10^8$ |

Thus, it can be understood that images with less, defects could be obtained with favorable material transport properties in Examples. In particular, favorable material transport properties cannot be achieved until the recording medium cassette containing sheets laminated in the order of feeding is employed and, at the same time, the coefficient of static friction of the back layer surface of the image receptor layer is at a definite level (0.7 or less), i.e., both being the characteristics of the present invention.

The four color images transferred in Examples 4 to 6 were further transferred onto recording paper to form multicolor images. As a result, multicolor images having excellent image qualities and stable transfer density could be formed even in case of high energy laser recording with laser beams in two-dimensional multibeam arrangement under different temperature/humidity conditions.

To transfer onto paper, use was made of a thermal transfer apparatus provided with an insertion table having a coefficient of dynamic friction to the polyethylene terephthalate material of 0.1 to 0.7 and showing a transport speed of 15 to 50 mm/sec. The Vickers hardness of the heat roll material in this thermal transfer apparatus, which is preferably from 10 to 100, was 70 in practice.

The obtained images were favorable under all of the three environmental temperature/humidity conditions.

The thermal transfer sheets (K, M and Y) produced above and the image receptor sheet and the thermal transfer sheet C having been produced in (I) were surface-cleaned and laminated in the order of feeding/transporting. Each set of the laminate was packaged and stored at room temperature for 1 week.

The above-described recording medium package was opened and a set of the laminate composed of the image receptor sheet and the thermal transfer sheets was set into a recording medium cassette as such. Then the cassette was attached to the recording medium feeding unit in a recorder and image recording was performed as in (I). As the results, the thermal transfer sheets could be transported in a stable state without causing positioning error or jamming and the obtained image had excellent qualities free from any defect caused by foreign materials.

INDUSTRIAL APPLICABILITY

According to the present invention, it is possible to provide a laser thermal transfer recording method whereby an image receptor sheet and thermal transfer sheets can be transported and fed in a stable state without causing jamming or positioning error to thereby give an image free from any defect in the image caused by the adhesion of foreign materials or mistaken color recording order due to an error in manual operation. Moreover, it is possible to provide contract proofs usable as a substitute for the existing proof sheets or analog color proofs in these days of CTP wherein no film is needed any more. Using these proofs, a high color reproducibility agreeing with printed matters or analog color proofs can be achieved and thus customers' approval can be obtained. It is also possible to provide a DDCP system wherein pigment-type colorants similar to printing inks are employed and whereby images can be transferred onto paper without causing moires, etc. It is also possible to provide a large sized (A2/B2) digital direct color proof system with a high approximation to printed matters wherein pigment-type colorants similar to printing inks are employed and whereby images can be transferred onto paper by dot recording. It is furthermore possible to provide a multicolor image formation method whereby an image having excellent qualities and a stable transfer density can be formed in case of high energy laser-recording with the use of laser beams in multi-beam two-dimensional arrangement under different temperature/humidity conditions.

What is claimed is:

1. A laser thermal transfer recording method comprising the steps of:

feeding an image receptor sheet comprising an image receptor layer and a plural number of thermal transfer sheets each comprising at least a photothermal conversion layer, an image formation layer and a substrate from a recording medium cassette;

superposing the image receptor layer of the image receptor sheet upon the image formation layer of the thermal transfer sheets to hold them on a recording medium support member; and irradiating the thermal transfer sheets with laser beams appropriate for image data to transfer the laser-irradiated regions on the image formation layer onto the image receptor layer of the image receptor sheet thereby recording an image, wherein the image receptor sheet and the thermal transfer sheets are laminated in an order of feeding into the recording medium support member and contained in the recording medium cassette, and a coefficient of static friction of a back layer surface of at least one of the image receptor sheet and the thermal transfer sheets is 0.7 or below.

2. The laser thermal transfer recording method according to claim 1, wherein a package, which has the image receptor sheet and the thermal transfer sheets laminated in the order of feeding into the recording medium support member and packed therein, is opened and then the laminated image receptor sheet and thermal transfer sheets are set in the recording medium cassette at once.

3. The laser thermal transfer recording method according to claim 1 or 2, wherein a coefficient of static friction of a surface of the image receptor layer of the image receptor sheet is 0.5 or below.

4. The laser thermal transfer recording method according to any of claims 1 to 3, wherein a surface roughness Rz of a surface of the image receptor layer of the image receptor sheet is from 1 to 5 μm.

5. The laser thermal transfer recording method according to any of claims 1 to 4, wherein a surface roughness Rz of a surface of the back layer of the image receptor sheet is 3 μm or below.

6. The laser thermal transfer recording method according to any of claims 1 to 5, wherein a surface electrical resistance SR of a surface of the image receptor layer of the image receptor sheet is $10^{14}\Omega$ or below when measured at 23° C. under 55% RH.

7. The laser thermal transfer recording method according to any of claims 1 to 6, wherein a surface electrical resistance SR of a surface of the back layer of the image receptor sheet is $10^{12}\Omega$ or below when measured at 23° C. under 55% RH.

8. The laser thermal transfer recording method according to any of claims 1 to 7, wherein a coefficient of static friction of a surface of the image formation layer of the thermal transfer sheets is 0.5 or below.

9. The laser thermal transfer recording method according to any of claims 1 to 8, wherein a surface roughness Rz of a surface of the image formation layer of the thermal transfer sheets is 3 μm or below.

10. The laser thermal transfer recording method according to any of claims 1 to 9, wherein a surface roughness Rz of a surface of the back layer of the thermal transfer sheets is 7 μm or below.

11. The laser thermal transfer recording method according to any of claims 1 to 10, wherein a surface electrical resistance SR of a surface of the image formation layer of the thermal transfer sheets is $10^{11}\Omega$ or below when measured at 23° C. under 55% RH.

* * * * *